(12) United States Patent
Song et al.

(10) Patent No.: US 11,296,226 B2
(45) Date of Patent: Apr. 5, 2022

(54) TRANSISTOR HAVING WRAP-AROUND SOURCE/DRAIN CONTACTS AND UNDER-CONTACT SPACERS

(71) Applicant: International Business Machines Corporation, Armonk, NY (US)

(72) Inventors: Yi Song, Milpitas, CA (US); Praveen Joseph, Albany, NY (US); Andrew Greene, Slingerlands, NY (US); Kangguo Cheng, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 5 days.

(21) Appl. No.: 16/654,167

(22) Filed: Oct. 16, 2019

(65) Prior Publication Data
US 2021/0119031 A1 Apr. 22, 2021

(51) Int. Cl.
*H01L 29/78* (2006.01)
*H01L 29/66* (2006.01)
*H01L 29/08* (2006.01)
*H01L 29/10* (2006.01)
(Continued)

(52) U.S. Cl.
CPC .... *H01L 29/785* (2013.01); *H01L 21/823807* (2013.01); *H01L 21/823814* (2013.01); *H01L 21/823821* (2013.01); *H01L 21/823871* (2013.01); *H01L 27/0924* (2013.01); *H01L 29/0847* (2013.01); *H01L 29/1037* (2013.01);
(Continued)

(58) Field of Classification Search
CPC ........... H01L 2029/7858; H01L 29/785; H01L 29/66795; H01L 29/0847; H01L 29/1037; H01L 21/823807; H01L 21/823814; H01L 21/823821; H01L 21/823871; H01L 27/0924; H01L 21/823475; H01L 27/088; H01L 21/823425; H01L 29/78696; H01L 29/42392; H01L 29/41725; H01L 29/66545; H01L 29/0673; H01L 29/66439
See application file for complete search history.

(56) References Cited

U.S. PATENT DOCUMENTS

| 8,778,768 B1 | 7/2014 | Chang et al. |
| 9,653,287 B2 | 5/2017 | Rodder et al. |
| 9,761,722 B1 | 9/2017 | Jagannathan et al. |

(Continued)

OTHER PUBLICATIONS

Loubet et al., "Stacked Nanosheet Gate-All-Around Transistor to Enable Scaling Beyond FinFET", 2017 Symposium on VLSI Technology Digest of Technical Papers, pp. T230-T231.

*Primary Examiner* — Nilufa Rahim
(74) *Attorney, Agent, or Firm* — Cantor Colburn LLP; Erik Johnson

(57) ABSTRACT

Embodiments of the invention are directed to a method of forming a semiconductor device. In a non-limiting example, the method includes forming a first channel region over a substrate, forming a second channel region over the first channel region, and forming a merged source or drain (S/D) region over the substrate and adjacent to the first channel region and the second channel region. The merged S/D region is communicatively coupled to the first channel region and the second channel region. A wrap-around S/D contact is formed such that it is on a top surface, sidewalls, and a bottom surface of the merged S/D region.

11 Claims, 20 Drawing Sheets

(51) Int. Cl.
  *H01L 21/8238*  (2006.01)
  *H01L 27/092*  (2006.01)

(52) U.S. Cl.
  CPC  *H01L 29/66795* (2013.01); *H01L 2029/7858* (2013.01)

(56) References Cited

U.S. PATENT DOCUMENTS

| | | | |
|---|---|---|---|
| 9,847,390 | B1 | 12/2017 | Xie et al. |
| 9,881,998 | B1 | 1/2018 | Cheng et al. |
| 9,947,804 | B1* | 4/2018 | Frougier ............ H01L 29/78696 |
| 10,170,638 | B1 | 1/2019 | Reznicek |
| 2014/0001520 | A1 | 1/2014 | Glass et al. |
| 2014/0209855 | A1 | 7/2014 | Cea et al. |
| 2018/0090582 | A1 | 3/2018 | Adusumilli et al. |
| 2019/0207016 | A1* | 7/2019 | Reboh ............... H01L 29/66439 |
| 2019/0273143 | A1* | 9/2019 | Leobandung ..... H01L 29/78618 |
| 2019/0341448 | A1* | 11/2019 | Bourjot ............... H01L 29/0653 |
| 2020/0006478 | A1* | 1/2020 | Hsu ....................... H01L 27/088 |
| 2020/0303502 | A1* | 9/2020 | Bomberger ......... H01L 29/0673 |

* cited by examiner

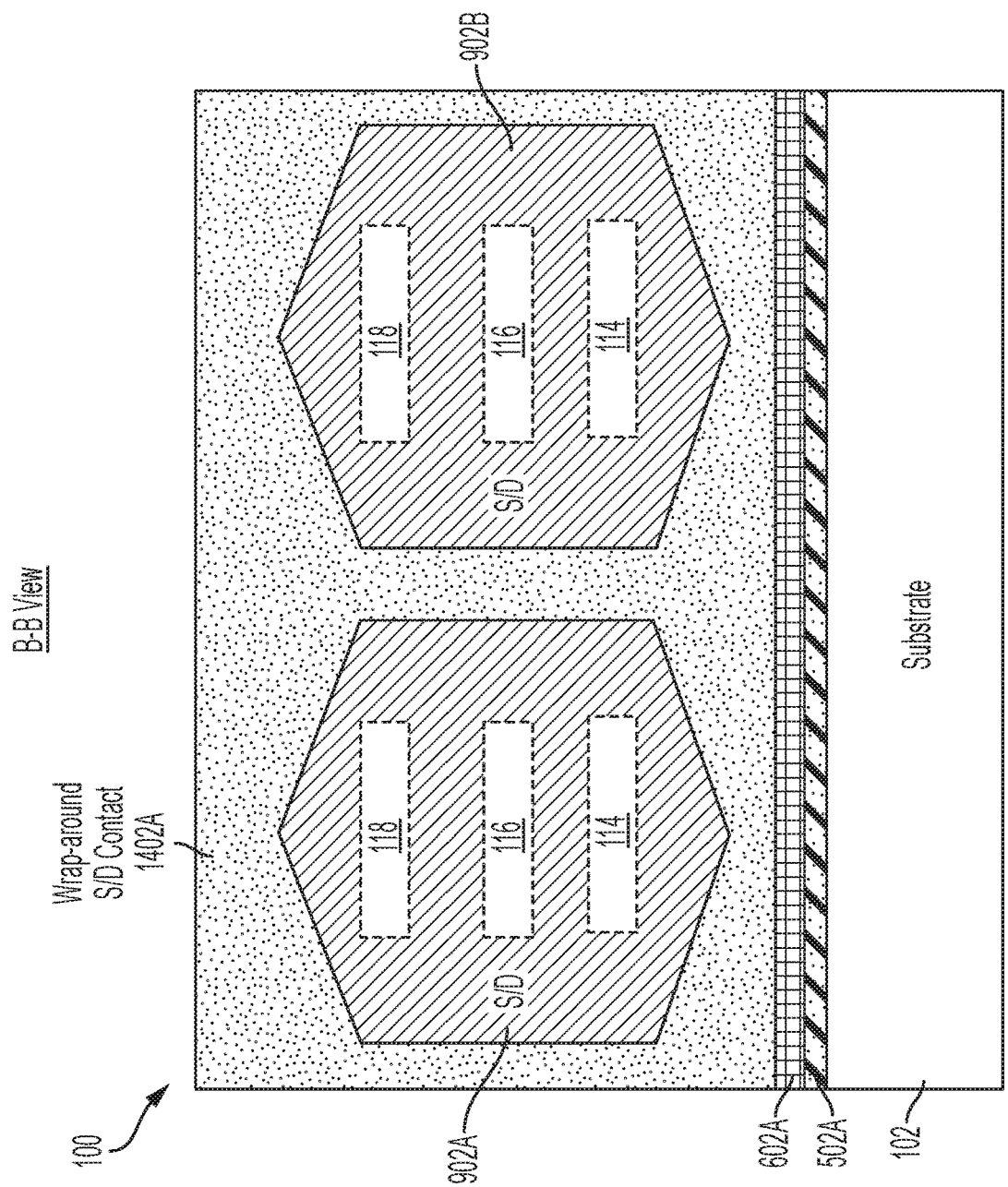

US 11,296,226 B2

TRANSISTOR HAVING WRAP-AROUND SOURCE/DRAIN CONTACTS AND UNDER-CONTACT SPACERS

BACKGROUND

The present invention relates in general to fabrication methods and resulting structures for semiconductor devices. More specifically, the present invention relates to fabrication methods and resulting structures for transistors having wrap-around contacts and under-contact spacers configured to reduce the transistor's source or drain (S/D) contact resistance, and configured to reduce any electrical connectivity (e.g., parasitic capacitance) between the wrap-around contact and the underlying substrate.

In contemporary semiconductor device fabrication processes, a large number of semiconductor devices, such as n-type field effect transistors (nFETs) and p-type field effect transistors (pFETs), are fabricated on a single wafer. Non-planar transistor device architectures (e.g., fin-type FETs (FinFETs) and nanosheet FETs) can provide increased device density and increased performance over planar transistors. For example, nanosheet transistors, in contrast to conventional planar FETs, include a gate stack that wraps around the full perimeter of multiple nanosheet channel regions for improved control of channel current flow. Nanosheet transistors enable full depletion in the nanosheet channel regions and reduce short-channel effects.

SUMMARY

Embodiments of the invention are directed to a method of forming a semiconductor device. In a non-limiting example, the method includes forming a first channel region over a substrate, forming a second channel region over the first channel region, and forming a merged source or drain (S/D) region over the substrate and adjacent to the first channel region and the second channel region. The merged S/D region is communicatively coupled to the first channel region and the second channel region. A wrap-around S/D contact is formed such that it is on a top surface, a sidewall, and a bottom surface of the merged S/D region.

Embodiments of the invention are directed to a method of forming a semiconductor device. In a non-limiting example, the method includes forming a channel region over a substrate and forming a S/D trench over the substrate, wherein the S/D trench includes a bottom trench region extending into the substrate. A S/D region is formed within the S/D trench and adjacent to the channel region, wherein the S/D region does not extend below a major surface of the substrate and does not extend into the bottom trench region. The S/D region is communicatively coupled to the channel region. A wrap-around S/D contact is formed such that it is on a top surface, a sidewall, and a bottom surface of the S/D region.

Embodiments of the invention are directed to a semiconductor device. In a non-limiting example, the semiconductor device includes a channel region formed over a substrate. A S/D trench is formed over the substrate, wherein the S/D trench includes a bottom trench region that is configured to extend into the substrate. A S/D region is formed within the S/D trench and adjacent to the channel region. The S/D region does not extend below a major surface of the substrate and does not extend into the bottom trench region. The S/D region is communicatively coupled to the channel region. The device further includes a wrap-around S/D contact formed on a top surface, a sidewall, and a bottom surface of the S/D region.

Additional features and advantages are realized through techniques described herein. Other embodiments and aspects are described in detail herein. For a better understanding, refer to the description and to the drawings.

BRIEF DESCRIPTION OF THE DRAWINGS

The subject matter which is regarded as embodiments is particularly pointed out and distinctly claimed in the claims at the conclusion of the specification. The foregoing and other features and advantages of the embodiments are apparent from the following detailed description taken in conjunction with the accompanying drawings in which:

FIGS. 1-16B depict a nanosheet-based structure after various fabrication operations for forming a GAA nanosheet FET in accordance with aspect of the invention, wherein the GAA nanosheet FET is configured to include wrap-around source or drain (S/D) contacts and bottom spacers, wherein the wrap-around S/D contacts are configured and arranged to reduce S/D contact resistance, and wherein the bottom spacers are configured and arranged to reduce or eliminate electrical conduction paths between the wrap-around S/D contacts and the underlying substrate, in which:

FIG. 1 depicts a cross-sectional view, taken along line A-A, of a nanosheet-based structure after initial fabrication operations in accordance with aspects of the present invention; for brevity, the top-down views shown in FIGS. 11B and 12B are used as the reference point for figures described herein that are taken along line A-A even though the figure being described may or may not depict the nanosheet-based structure at a different fabrication stage than is shown in FIGS. 11B and 12B.;

FIG. 3 depicts a cross-sectional view, taken along line A-A of FIGS. 11B and 12B, of the nanosheet-based structure after additional fabrication operations in accordance with aspects of the present invention;

FIG. 4 depicts a cross-sectional view, taken along line A-A of FIGS. 11B and 12B, of the nanosheet-based structure after additional fabrication operations in accordance with aspects of the present invention;

FIG. 5 depicts a cross-sectional view, taken along line A-A of FIGS. 11B and 12B, of the nanosheet-based structure after additional fabrication operations in accordance with aspects of the present invention;

FIG. 6 depicts a cross-sectional view, taken along line A-A of FIGS. 11B and 12B, of the nanosheet-based structure after additional fabrication operations in accordance with aspects of the present invention;

FIG. 7 depicts a cross-sectional view, taken along line A-A of FIGS. 11B and 12B, of the nanosheet-based structure after additional fabrication operations in accordance with aspects of the present invention;

FIG. 8 depicts a cross-sectional view, taken along line A-A of FIGS. 11B and 12B, of the nanosheet-based structure after additional fabrication operations in accordance with aspects of the present invention;

FIG. 9 depicts a cross-sectional view, taken along line A-A of FIGS. 11B and 12B, of the nanosheet-based structure after additional fabrication operations in accordance with aspects of the present invention;

FIG. 10 depicts a cross-sectional view, taken along line A-A of FIGS. 11B and 12B, of the nanosheet-based structure after additional fabrication operations in accordance with aspects of the present invention;

FIG. 13 depicts a cross-sectional view, taken along line A-A of FIGS. 11B and 12B, of the nanosheet-based structure after additional fabrication operations in accordance with aspects of the present invention;

FIG. 14 depicts a cross-sectional view, taken along line A-A of FIGS. 11B and 12B, of the nanosheet-based structure after additional fabrication operations in accordance with aspects of the present invention;

FIG. 15 depicts a cross-sectional view, taken along line A-A of FIGS. 11B and 12B, of the nanosheet-based structure after additional fabrication operations in accordance with aspects of the present invention;

FIG. 16B depicts a cross-sectional view, taken along line B-B of FIGS. 11B and 12B, of the nanosheet-based structure after additional fabrication operations in accordance with aspects of the present invention.

DETAILED DESCRIPTION

Figure 1:
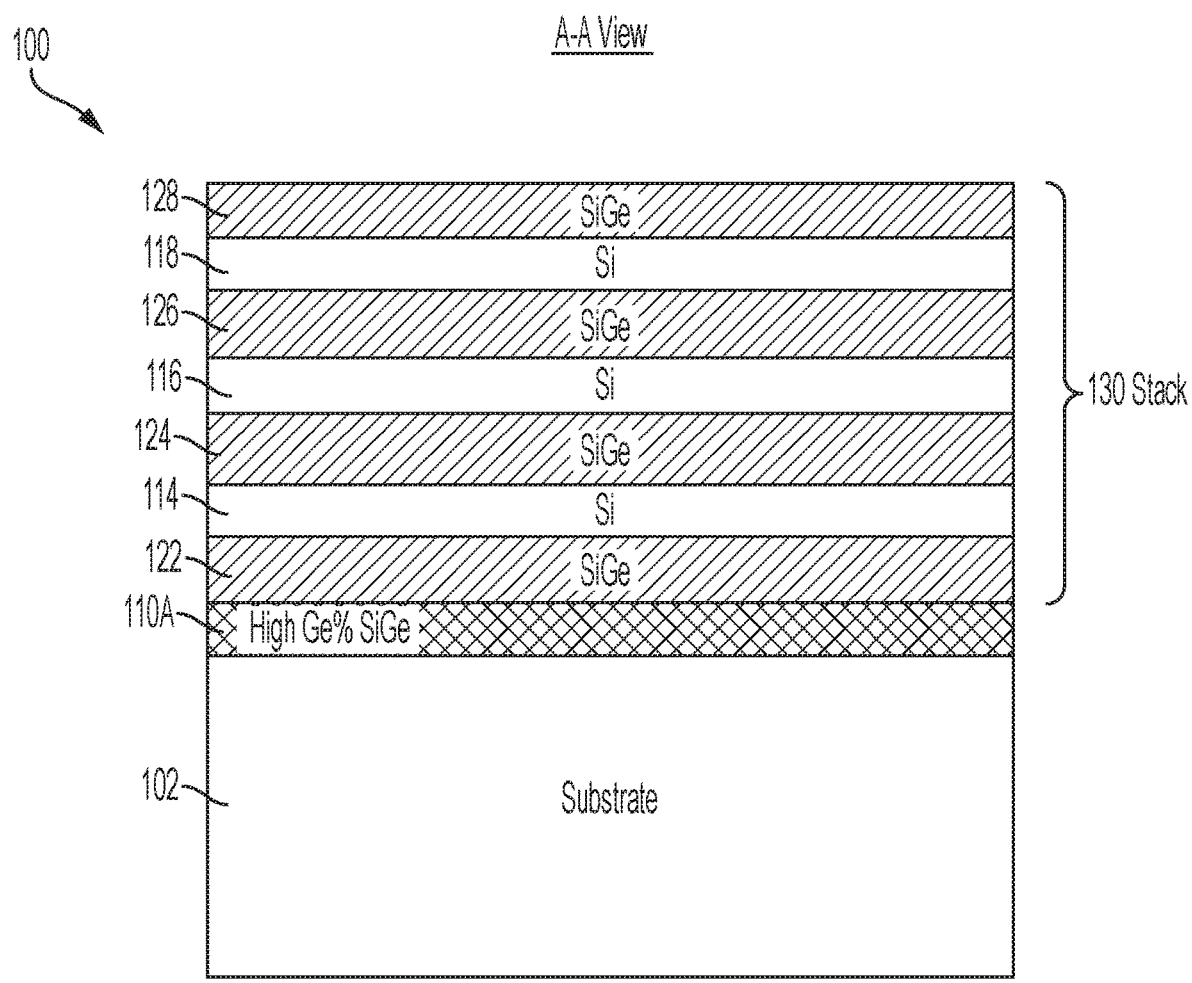

Although this detailed description includes examples of how aspects of the invention can be implemented to form wrap-around S/D contacts and under-contact spacers in an exemplary gate-all-around (GAA) nanosheet FET architecture having silicon (Si) channel nanosheets and SiGe sacrificial layers, implementation of the teachings recited herein are not limited to a particular type of FET structure or combination of materials. Rather, embodiments of the present invention are capable of being implemented in conjunction with any other type of transistor device (e.g., planar FETs, FinFETs, vertical FETs, and the like) or material, now known or later developed, wherein S/D contact are utilized, and wherein it is desirable to reduce resistance at the interface between the S/D contact and the S/D region, as well as reduce unwanted communication paths between the S/D contact and the substrate.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to a description of technologies that are more specifically relevant to the present invention, transistors are semiconductor devices commonly found in a wide variety of ICs. A transistor is essentially a switch. When a voltage is applied to a gate of the transistor that is greater than a threshold voltage, the switch is turned on, and current flows through the transistor. When the voltage at the gate is less than the threshold voltage, the switch is off, and current does not flow through the transistor.

Typical semiconductor devices are formed using active regions of a wafer. The active regions are defined by isolation regions used to separate and electrically isolate adjacent semiconductor devices. For example, in an IC having a plurality of metal oxide semiconductor field effect transistors (MOSFETs), each MOSFET has a source and a drain that are formed in an active region of a semiconductor layer by implanting n-type or p-type impurities in the layer of semiconductor material. Disposed between the source and the drain is a channel (or body) region. Disposed above the body region is a gate electrode. The gate electrode and the body are spaced apart by a gate dielectric layer.

MOSFET-based ICs are fabricated using so-called complementary metal oxide semiconductor (CMOS) fabrication technologies. In general, CMOS is a technology that uses complementary and symmetrical pairs of p-type and n-type MOSFETs to implement logic functions. The channel region connects the source and the drain, and electrical current flows through the channel region from the source to the drain. The electrical current flow is induced in the channel region by a voltage applied at the gate electrode.

The wafer footprint of an FET is related to the electrical conductivity of the channel material. If the channel material has a relatively high conductivity, the FET can be made with a correspondingly smaller wafer footprint. A known method of increasing channel conductivity and decreasing FET size is to form the channel as a nanostructure. For example, a so-called gate-all-around (GAA) nanosheet FET is a known architecture for providing a relatively small FET footprint by forming the channel region as a series of nanosheets. In a known GAA configuration, a nanosheet-based FET includes a source region, a drain region and stacked nanosheet channels between the source and drain regions. A gate surrounds the stacked nanosheet channels and regulates electron flow through the nanosheet channels between the source and drain regions. GAA nanosheet FETs are fabricated by forming alternating layers of channel nanosheets and sacrificial layers. The sacrificial layers are released from the channel nanosheets before the FET device is finalized. For n-type FETs, the channel nanosheets are typically silicon (Si) and the sacrificial layers are typically silicon germanium (SiGe). For p-type FETs, the channel nanosheets can be SiGe and the sacrificial layers can be Si. In some implementations, the channel nanosheet of a p-type FET can be SiGe or Si, and the sacrificial layers can be Si or SiGe. Forming the GAA nanosheets from alternating layers of a first type of semiconductor material (e.g., Si for n-type FETs, and SiGe for p-type FETs) and sacrificial layers formed from a second type of semiconductor material (e.g., SiGe for n-type FETs, and Si for p-type FETs) provides superior channel electrostatics control, which is necessary for continuously scaling gate lengths down. The use of multiple layered SiGe/Si sacrificial/channel nanosheets (or Si/SiGe sacrificial/channel nanosheets) to form the channel regions in GAA FET semiconductor devices provides desirable device characteristics, including the introduction of strain at the interface between SiGe and Si.

Although nanosheet channel FET architectures provide increased device density over planar FET architectures, there are still challenges when attempting to fabricate nanosheet channel FETs that provide the performance characteristics required for a particular application. For example, as the size of MOSFETs and other devices decreases, the dimensions of S/D regions, channel regions, and gate electrodes also decrease. Accordingly, with device size reductions, the contribution of middle-of-line (MOL) contact resistance to the total parasitic resistance is increasing in advanced CMOS devices. Thus, resistance at the interface between the metallic S/D contact and the epitaxially grown S/D regions can be a major contributor to the total external parasitic resistance.

Turning now to an overview of aspects of the invention, embodiments of the invention provide fabrication methods and resulting structures for transistors having wrap-around contacts configured to reduce contact resistance by increasing the surface area of the interface between the metallic S/D contact and the epitaxially grown S/D region of the transistor. In embodiments of the invention, the surface area of the interface between the S/D contact and the S/D region is increased by forming a wrap-around S/D contact that is around an upper region of the S/D region and extends to a bottom surface of the S/D region. In aspects of the invention, a first channel region and a second channel region are formed over a substrate. A merged S/D region is formed over the substrate and adjacent to the first channel region and the second channel region. The merged S/D region is communicatively coupled to the first channel region and the second channel region, and a wrap-around S/D contact is formed on a top surface, sidewalls, and a bottom surface of the merged S/D region. In some embodiment of the invention, the wrap-around S/D contact is on the bottom surface of the merged S/D region but does not extend completely around a circumference of the merged S/D region. In some embodiment of the invention, the wrap-around S/D contact is configured to extend completely around a circumference of the merged S/D region. In aspects of the invention, the circumference of a S/D region includes a top surface, sidewalls, and a bottom surface of the S/D region. In aspects of the invention, communicatively coupling the merged S/D region to the first channel region and the second channel region can be implemented by epitaxially growing the merged S/D region from the first channel region and the second channel region. In aspects of the invention, forming the merged S/D region includes epitaxially growing a first S/D region from the first channel region and epitaxially growing a second S/D region from the second channel region. Epitaxially growing the first S/D region and the second S/D region is continued until the first S/D region merges with the second S/D region to form the merged S/D region.

In some aspects of the invention, an under-contact spacer or bottom spacer is formed below the wrap-around S/D contact and is positioned between the wrap-around S/D contact and the substrate to prevent electrical connections between the wrap-around S/D contact and the substrate. In some aspects of the invention, the under-contact spacer or the bottom spacer is a bi-layer structure formed from a first under-contact spacer layer and a second under-contact spacer layer, thereby providing additional separation between the wrap-around S/D contact and the substrate. The first under-contact spacer layer can include a nitride spacer material, and the second under-contact spacer layer can include an oxide spacer material.

A method of forming a semiconductor device in accordance with aspects of the invention can include forming a channel region over a substrate. A S/D trench is formed over the substrate. The S/D trench includes a bottom trench region configured to extend into the substrate. A S/D region is formed within the S/D trench and adjacent to the channel region such that the S/D region does not extend below a major surface of the substrate and does not extend into the bottom trench region. The S/D region is communicatively coupled to the channel region. A wrap-around S/D contact is formed on a top surface, sidewalls, and a bottom surface of the S/D region. In some embodiment of the invention, the wrap-around S/D contact is on the bottom surface of the S/D region but does not extend completely around a circumference of the S/D region. In some embodiment of the invention, the wrap-around S/D contact is configured such that it extends completely around a circumference of the S/D region. In aspects of the invention, an under-contact spacer is formed within the bottom trench region and positioned between the wrap-around S/D contact and the substrate. The under-contact spacer can include a first under-contact spacer layer and a second under-contact spacer layer, wherein the first under-contact spacer layer can include a nitride spacer material and the second under-contact spacer layer can include an oxide spacer material.

In aspects of the invention, the channel region includes a first channel region and a second channel region, and the S/D region includes a merged S/D region adjacent to the first channel region and the second channel region. The merged S/D region is communicatively coupled to the first channel region and the second channel region.

A semiconductor device in accordance with aspects of the invention can include a channel region formed over a substrate, along with a S/D trench formed over the substrate, wherein the S/D trench includes a bottom trench region configured to extend into the substrate. A S/D region is formed within the S/D trench and adjacent to the channel region, wherein the S/D region does not extend below a major surface of the substrate and does not extend into the bottom trench region. The S/D region is communicatively coupled to the channel region, and a wrap-around S/D contact is formed on a top surface, sidewalls, and a bottom surface of the S/D region. In some embodiment of the invention, the wrap-around S/D contact is on the bottom surface of the S/D region but does not extend completely around a circumference of the S/D region. In some embodiment of the invention, the wrap-around S/D contact is configured to extend completely around a circumference of the S/D region. In aspects of the invention, an under-contact spacer is formed within the bottom trench region and positioned between the wrap-around S/D contact and the substrate to prevent electrical connections between the wrap-around S/D contact and the substrate. In aspects of the invention, the under-contact spacer is formed from a first under-contact spacer layer and a second under-contact spacer layer to provide additional separation between the wrap-around S/D contact and the substrate.

In aspects of the invention, the channel region is formed from a first channel region and a second channel region. The S/D region is a merged S/D region adjacent to the first channel region and the second channel region, and the merged S/D region is communicatively coupled to the first channel region and the second channel region.

Turning now to a more detailed description of fabrication operations according to aspects of the invention, FIGS. 1-16B depict a nanosheet-based structure 100 after various fabrication operations for forming a GAA nanosheet FET having wrap-around source or drain (S/D) contacts and under-contact spacers configured and arranged to reduce S/D contact resistance and reduce unwanted electrical connection (e.g., parasitic capacitance) between the wrap-around contact and a substrate 102 in accordance with aspects of the invention. More specifically, FIG. 1 depicts a cross-sectional view, taken along line A-A, of the nanosheet-based structure 100 after initial fabrication operations in accordance with aspects of the present invention. For brevity, the top-down views shown in FIGS. 11B and 12B are used as the reference point for figures described herein that are taken along line A-A even though the figure being described may or may not depict the nanosheet-based structure 100 at a different fabrication stage than is shown in FIGS. 11B and 12B. As shown in FIG. 1, an initial SiGe layer 110A is formed over the substrate 102. The Ge percentage of the SiGe layer 110A is provided with a relatively high (e.g., above about 35%) Ge % in comparison to the Ge % (e.g. about 25% or less) in the SiGe sacrificial layers 122, 124, 126, 128 to provide etch selectivity of the initial SiGe layer 110A. An alternating series of the SiGe sacrificial layers 122, 124, 126, 128 and Si layers 114, 116, 118 are formed in a stack 130 over the initial SiGe layer 110A. In some embodiments of the invention, the SiGe sacrificial layers 122, 124, 126, 128 can be SiGe 25%. The notation "SiGe 25%" is used to indicate that 25% of the SiGe material is Ge and 75% of the SiGe material is Si. In embodiments of the invention, the Ge % of the layer 110A is sufficiently larger than the Ge % of the SiGe sacrificial layers 122, 124, 126, 128 to provide etch selectivity of the layer 110A with respect to the layers of the stack 130.

In embodiments of the invention, the initial layer 110A and the stack 130 can be formed by epitaxially growing one layer then the next until the desired number and desired thicknesses of the layers 110A, 122, 114, 124, 116, 126, 118, 128 are achieved. Epitaxial materials can be grown from gaseous or liquid precursors. Epitaxial materials can be grown using chemical vapor deposition (CVD), vapor-phase epitaxy (VPE), molecular-beam epitaxy (MBE), liquid-phase epitaxy (LPE), or other suitable processes. Epitaxial silicon, silicon germanium, and/or carbon doped silicon (Si:C) can be doped during deposition (in-situ doped) by adding dopants, n-type dopants (e.g., phosphorus or arsenic) or p-type dopants (e.g., boron or gallium), depending on the type of transistor.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surfaces, and generally do not deposit material on exposed surfaces, such as silicon dioxide or silicon nitride surfaces.

In some embodiments, the gas source for the deposition of epitaxial semiconductor material include a silicon containing gas source, a germanium containing gas source, or a combination thereof. For example, an epitaxial silicon layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

Figure 2A:
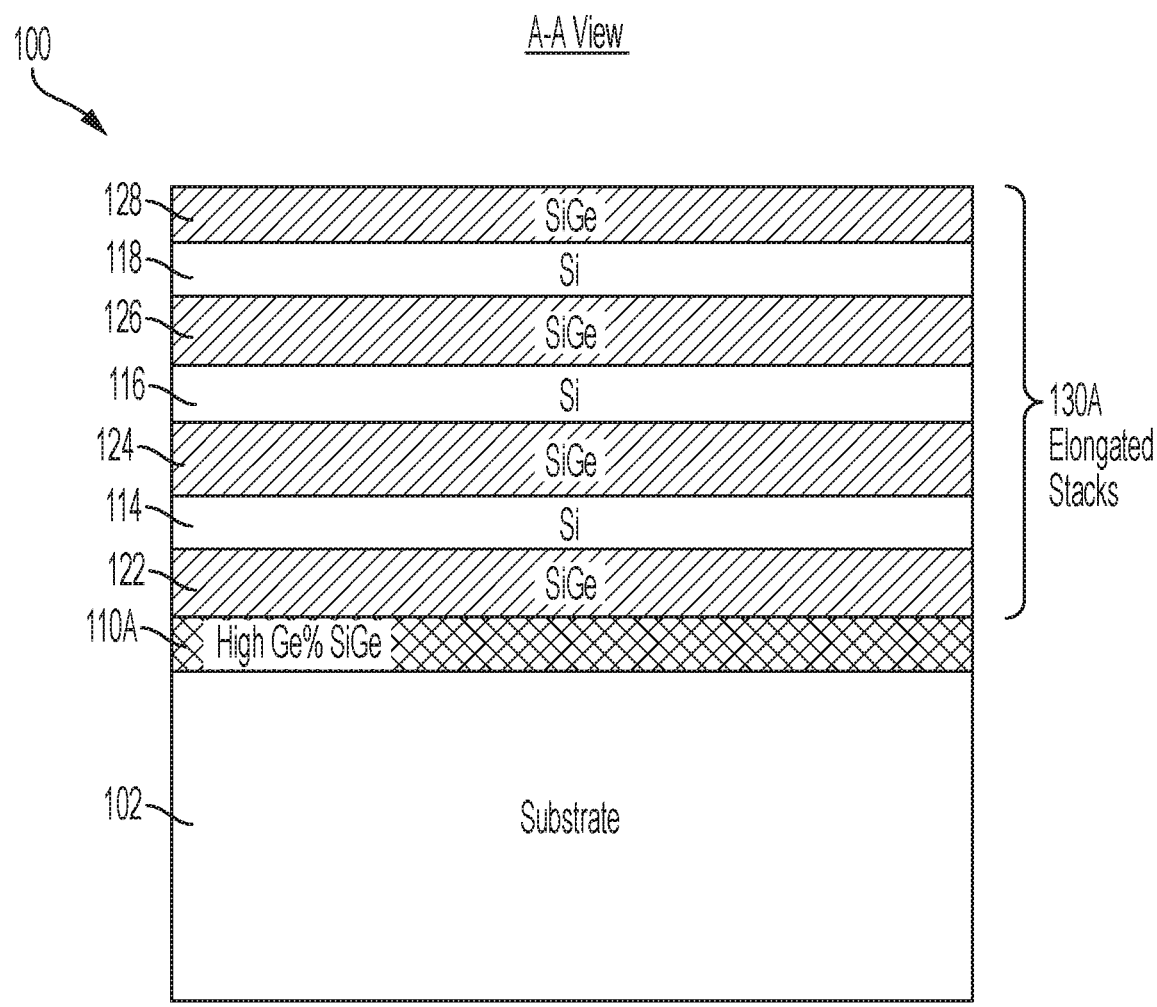
FIG. 2A depicts a cross-sectional view, taken along line A-A of FIGS. 11B and 12B, of the nanosheet-based structure after additional fabrication operations in accordance with aspects of the present invention.
Figure 2B:
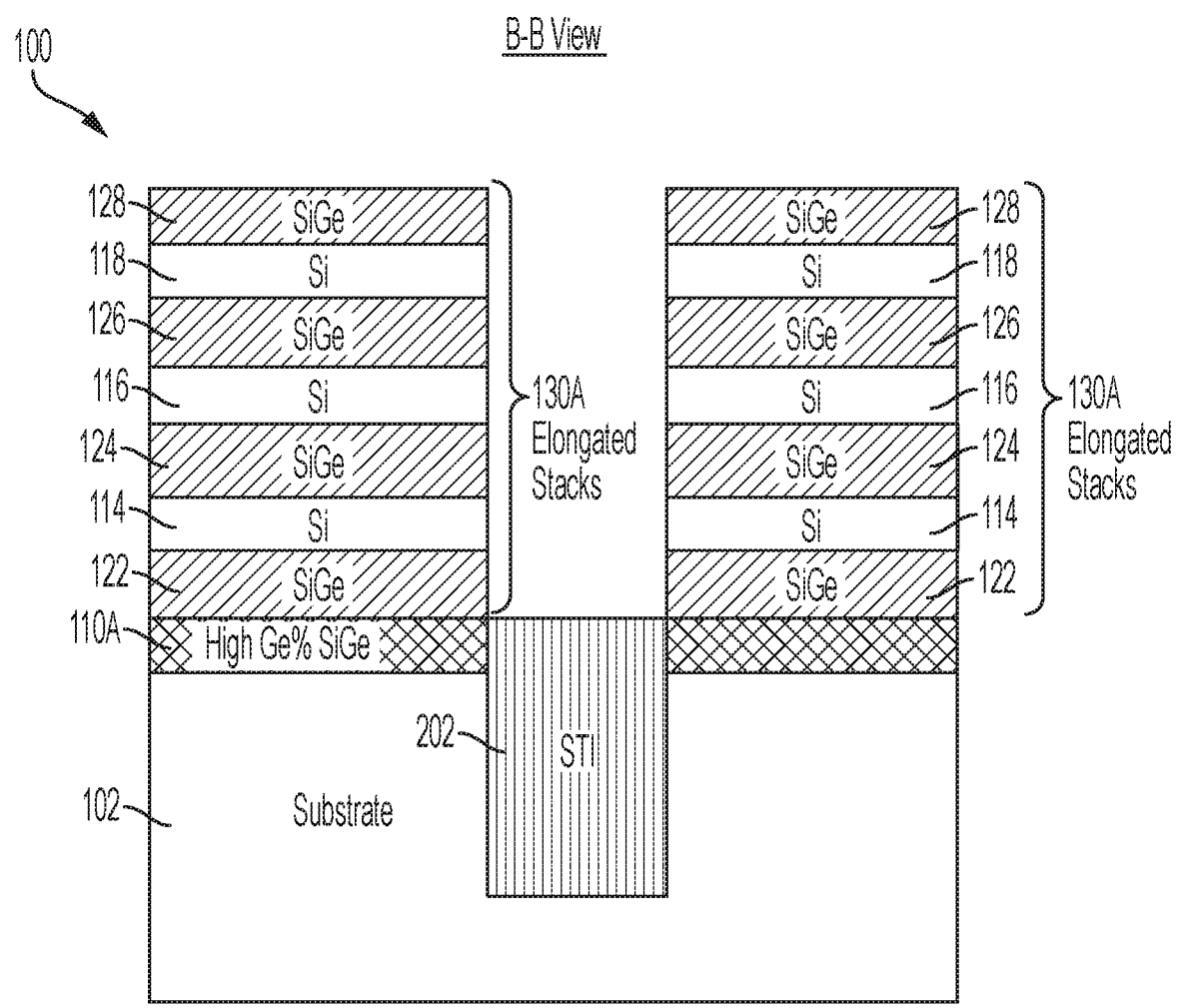
FIG. 2B depicts a cross-sectional view, taken along line B-B, of the nanosheet-based structure after additional fabrication operations in accordance with aspects of the present invention; for brevity, the top-down views shown in FIGS. 11B and 12B are used as the reference point for figures described herein that are taken along line B-B even though the figure being described may or may not depict the nanosheet-based structure at a different fabrication stage than is shown in FIGS. 11B and 12B.

FIG. 2A depicts a cross-sectional view, taken along line A-A of FIGS. 11B and 12B, of the nanosheet-based structure 100 after additional fabrication operations in accordance with aspects of the present invention, and FIG. 2B depicts a cross-sectional view, taken along line B-B, of the nanosheet-based structure 100 after the same fabrication operations shown in FIG. 2A. For brevity, the top-down views shown in FIGS. 11B and 12B are used as the reference point for figures described herein that are taken along line B-B even though the figure being described may or may not depict the nanosheet-based structure 100 at a different fabrication stage than is shown in FIGS. 11B and 12B. As best shown in FIG. 2B, the stack 130 (shown in FIG. 1) has been patterned and etched to convert the stack 130 into multiple elongated stacks 130A, and to form a shallow trench isolation (STI) trench in which an STI region 202 is formed. In embodiments of the invention, the STI trench extends through the initial layer 110A and into the substrate 102. In embodiments of the invention, the STI region 202 can be formed as an oxide. Each of the elongated stacks 130A includes the alternating series of sacrificial SiGe layers 122, 124, 126, 128 and Si layers 114, 116, 118 formed in a stack. An example process to form the elongated stacks 130A includes depositing a hard mask layer (not shown) on the stack 130 and patterning the hard mask layer into the desired dimensions of the elongated stacks 130A. The patterning of the hard mask layer is commensurate with a desired footprint and location of the elongated stacks 130A. According to an exemplary embodiment of the invention, a resist film (not shown) is deposited on the hard mask layer and patterned with the footprint and location of each elongated stack 130A. In one example, a RIE process is used to form the elongated stacks 130A and the STI trench. An example process to form the STI region 202 includes depositing an STI dielectric material (e.g., an oxide) in the STI trench and between the elongated stacks 130A followed by a CMP planarization and a recess of the STI dielectric material to form the STI region 202.

Figure 3:
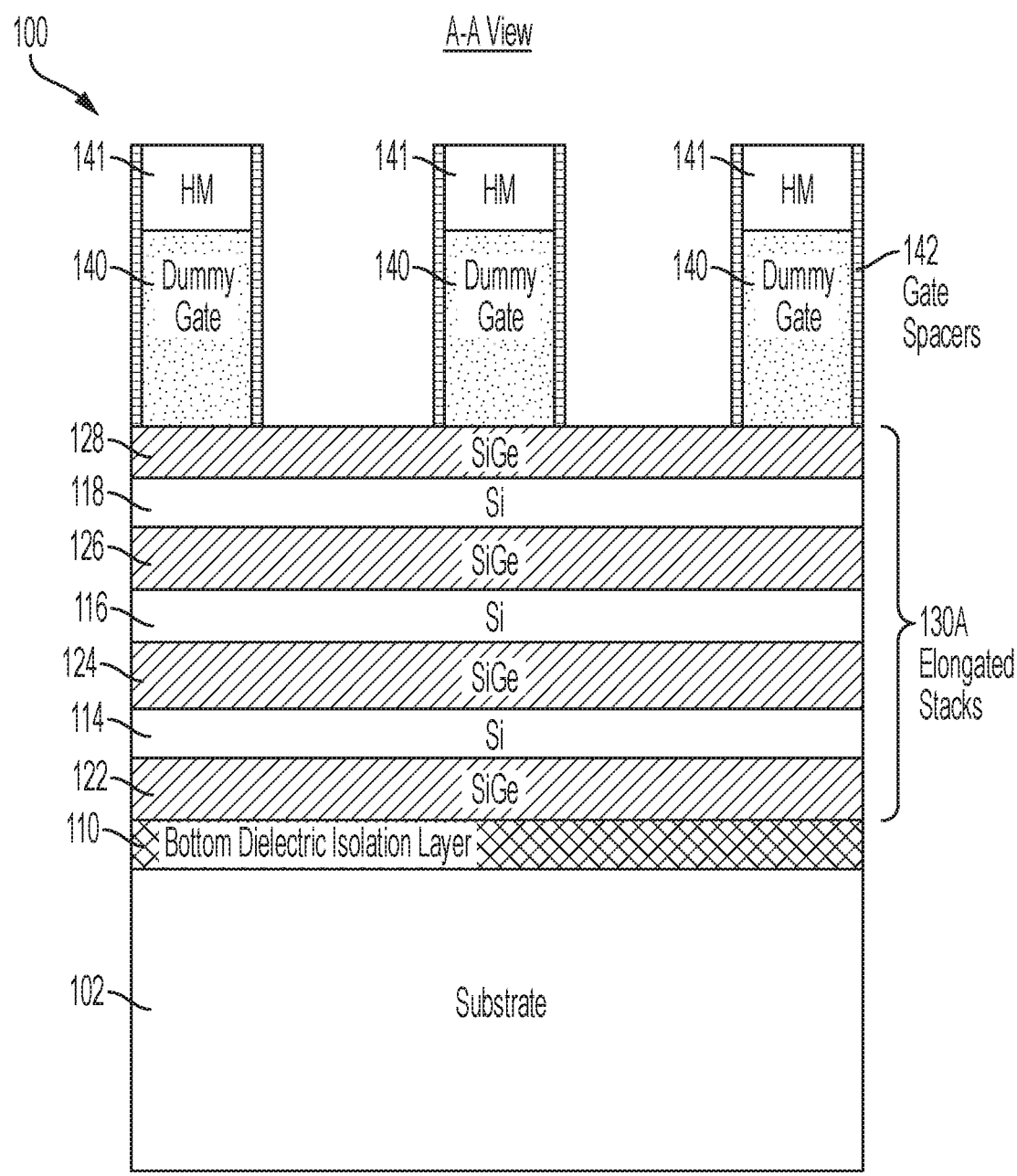

FIG. 3 depicts a cross-sectional view, taken along line A-A of FIGS. 11B and 12B, of the nanosheet-based structure 100 after additional fabrication operations in accordance with aspects of the present invention. As shown in FIG. 3, known fabrication operations have been used to form dummy gates 140, hard masks 141, and gate spacers 142 over and around the elongated stacks 130A. The known fabrication operations can include depositing a layer of amorphous silicon (a-Si) (not shown) over the elongated stacks 130A and planarizing the a-Si to a desired level. A hard mask layer (e.g., a nitride) (not shown) is deposited over the planarized a-Si. The hard mask layer is patterned and etched to form the hard masks 141. In some embodiments of the invention, the hard masks 141 can include a layer of a nitride material (e.g., SiN) or a bi-layer of a nitride material and an oxide material (e.g., SiN/SiO$_2$). The footprints of the hard masks 141 define the footprints of the dummy gates 140. An etch (e.g., an RIE) or a recess is applied to remove the portions of the a-Si layer that are not covered by the hard masks 141 to form the dummy gates 140 over and around the elongated stacks 130A.

Referring still to FIG. 3, known semiconductor fabrication operations are also used to form offset gate spacers 142 on sidewalls of the dummy gates 140 and the hard masks 141. In embodiments of the invention, the offset gate spacers 142 can be formed using a spacer pull down formation process. The offset gate spacers 142 can also be formed by a conformal deposition of a dielectric material (e.g., silicon oxide, silicon nitride, silicon oxynitride, SiBCN, SiOCN, SiOC, or any suitable combination of those materials) followed by a directional etch (e.g., RIE).

Referring still to FIG. 3, known fabrication operations have been used to remove the initial SiGe layer 110A and replace it with a bottom isolation region 110 (e.g., SiN). As previously noted herein, the initial SiGe layer 110A is provided with a sufficiently high Ge % (e.g., above about 35% Ge) that it can be selectively removed with respect to the layers of the elongated stacks 130A.

Figure 4:
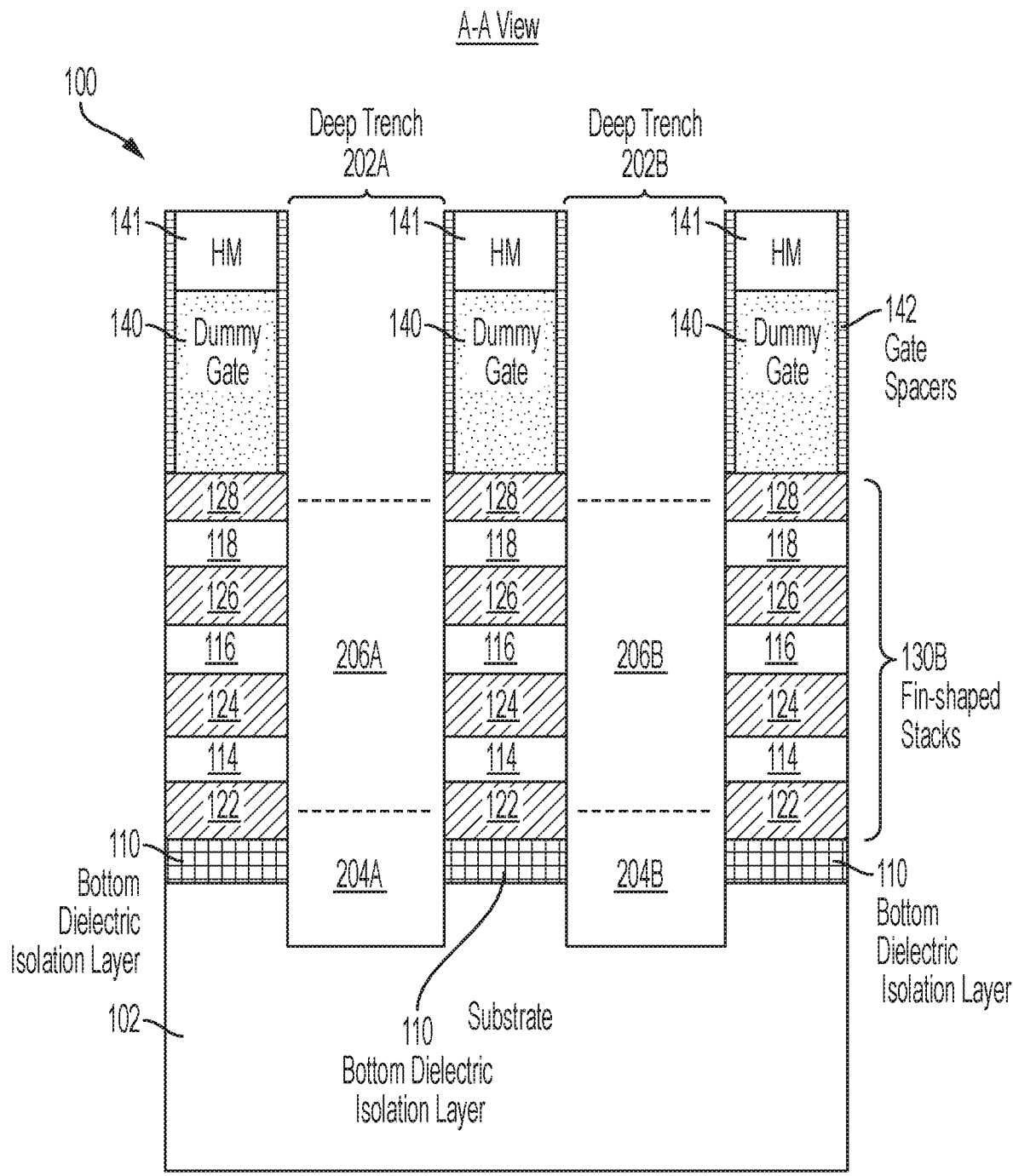

FIG. 4 depicts a cross-sectional view, taken along line A-A of FIGS. 11B and 12B, of the nanosheet-based structure 100 after additional fabrication operations in accordance with aspects of the present invention. As shown in FIG. 4, known fabrication operations have been used to further etch the elongated stacks 130A (shown in FIG. 3) to form fin-shaped stacks 130B. The portions of the elongated stacks 130A that are not covered by the offset gate spacers 142 and the dummy gates 140 are etched, thereby forming the fin-shaped stacks 130B having the dummy gates 140 and gate spacers 142 formed over the top and sidewalls of each fin-shaped stack 130B.

Referring still to FIG. 4, in accordance with aspects of the invention, etching the elongated stacks 130A (shown in FIG. 3) also forms deep trenches 202A, 202B. In accordance with aspects of the invention, the deep trenches 202A, 202B are formed to include a bottom trench region 204A, 204B and a S/D trench region 206A, 206B. In aspects of the invention, the bottom trench regions 204A, 204B extend into the substrate 102 (i.e., below a major surface (i.e., top surface) of the substrate 102) and are configured and arranged to accommodate under-contact spacers 802A, 802B (shown in FIG. 10) and bottom portions of wrap-around contacts 1402A, 1402B (shown in FIGS. 16A, 16B).

Figure 5:
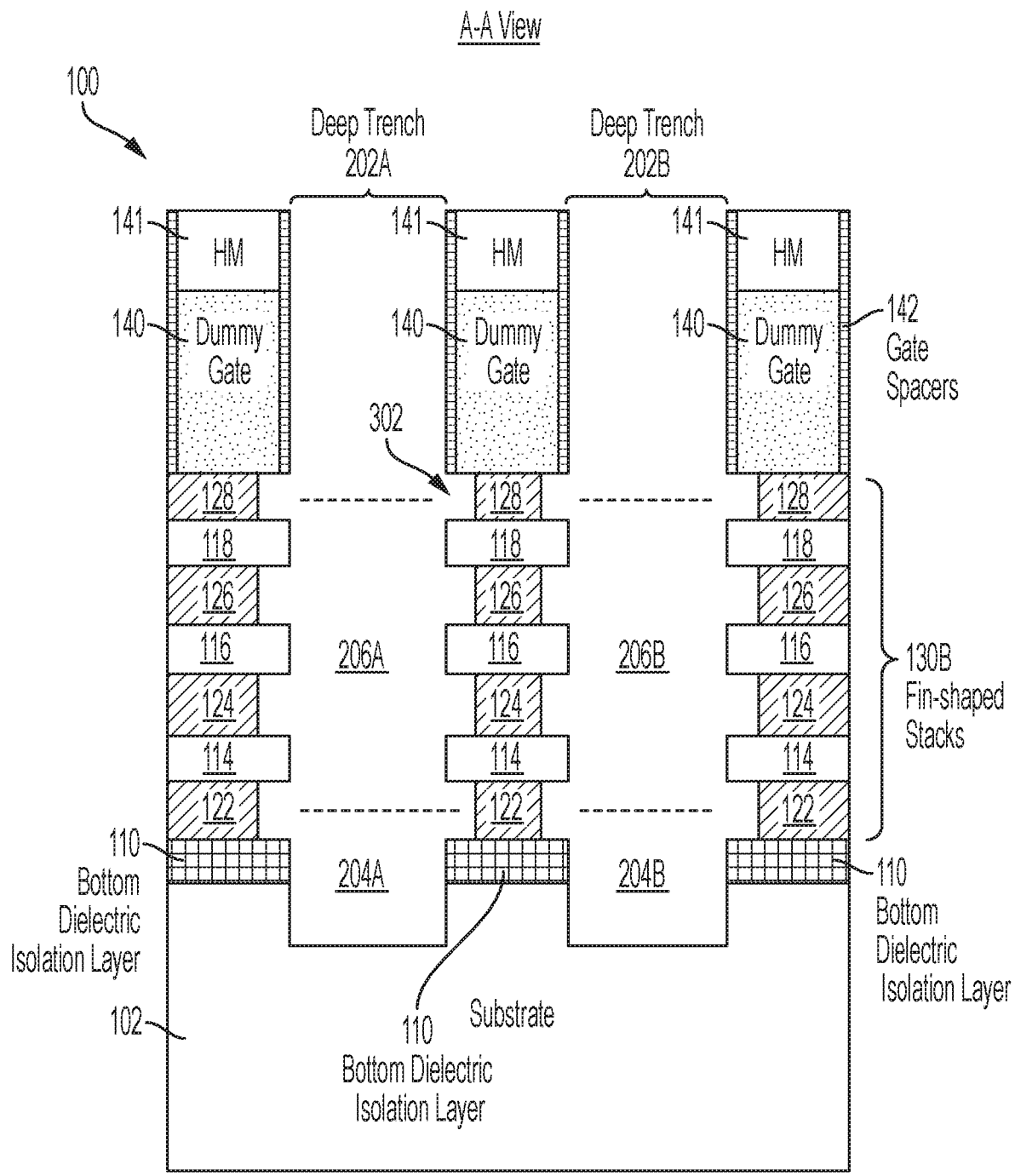

FIG. 5 depicts a cross-sectional view, taken along line A-A of FIGS. 11B and 12B, of the nanosheet-based structure 100 after additional fabrication operations in accordance with aspects of the present invention. As shown in FIG. 5, known semiconductor fabrication operations have been used to partially remove end regions of the sacrificial layers 122, 124, 126, 128 to form inner-spacer cavities 302. For example, the end regions of the sacrificial layers 122, 124, 126, 128 can be removed using a so-called "pull-back" process to pull the sacrificial layers 122, 124, 126, 128 back an initial pull-back distance. In embodiments of the invention, the pull-back process includes a reactive gas phase etch process that is well controlled for the targeted depth of the inner spacer cavities 302. The reactive gas phase etch process etches the sacrificial layer material (e.g., SiGe) without attacking the channel nanosheet material (e.g., Si).

Figure 6:
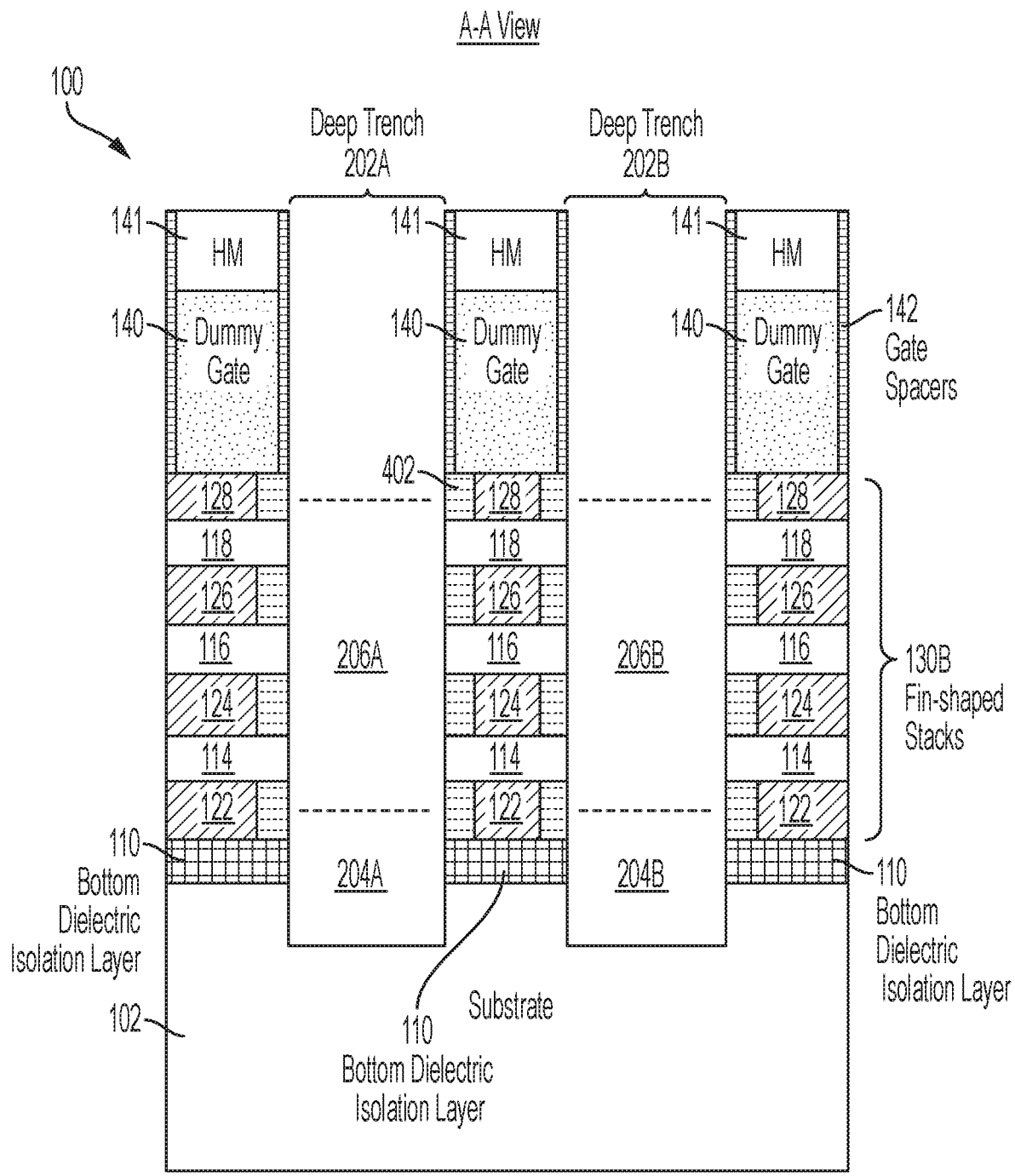

FIG. 6 depicts a cross-sectional view, taken along line A-A of FIGS. 11B and 12B, of the nanosheet-based structure 100 after additional fabrication operations in accordance with aspects of the present invention. As shown in FIG. 6, known semiconductor fabrication processes have been used to form inner spacers 402 in the inner-spacer cavities 302 (shown in FIG. 5). In embodiments of the invention, the inner spacers 402 can be formed conformally by CVD, or by atomic layer deposition (ALD) of a nitride containing material followed by anisotropic spacer RIE. Forming the inner spacers 402 from a nitride containing material (e.g., silicon nitride (SiN)) can prevent excess gauging during subsequent RIE processes (e.g., sacrificial layer removal) that are applied during the semiconductor device fabrication process.

Figure 7:
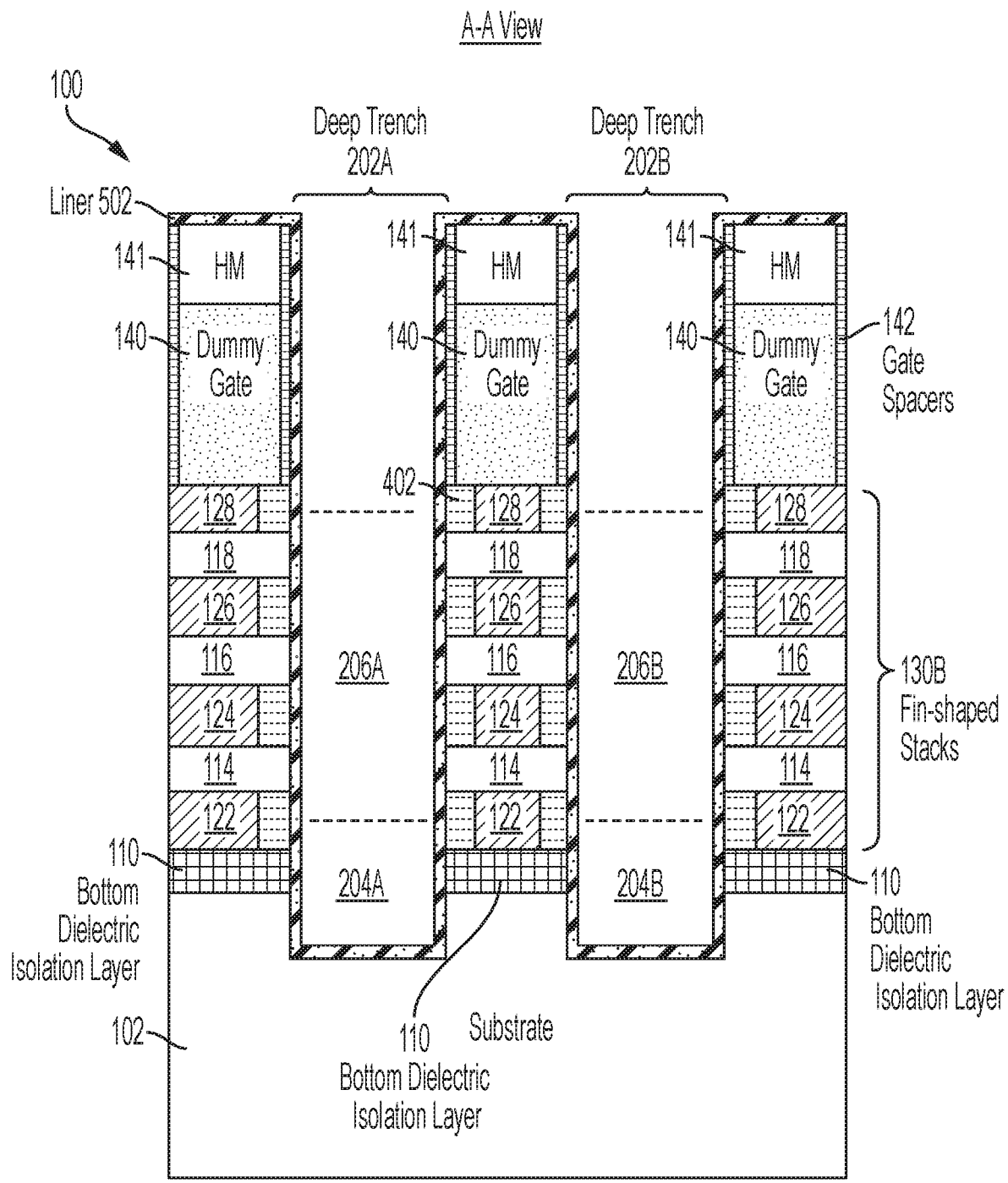

FIG. 7 depicts a cross-sectional view, taken along line A-A of FIGS. 11B and 12B, of the nanosheet-based structure 100 after additional fabrication operations in accordance with aspects of the present invention. As shown in FIG. 7, known semiconductor fabrication processes have been used to form a liner 502 configured and arranged as shown. In embodiments of the invention, the liner 502 can be deposited conformally by ALD. The liner 502 can be formed from a nitride containing material. In accordance with aspects of the invention, the liner 502 extends into the deep trenches 202A, 202B, and more specifically along sidewalls and the bottom surfaces of the bottom trench regions 204A, 204B.

Figure 8:
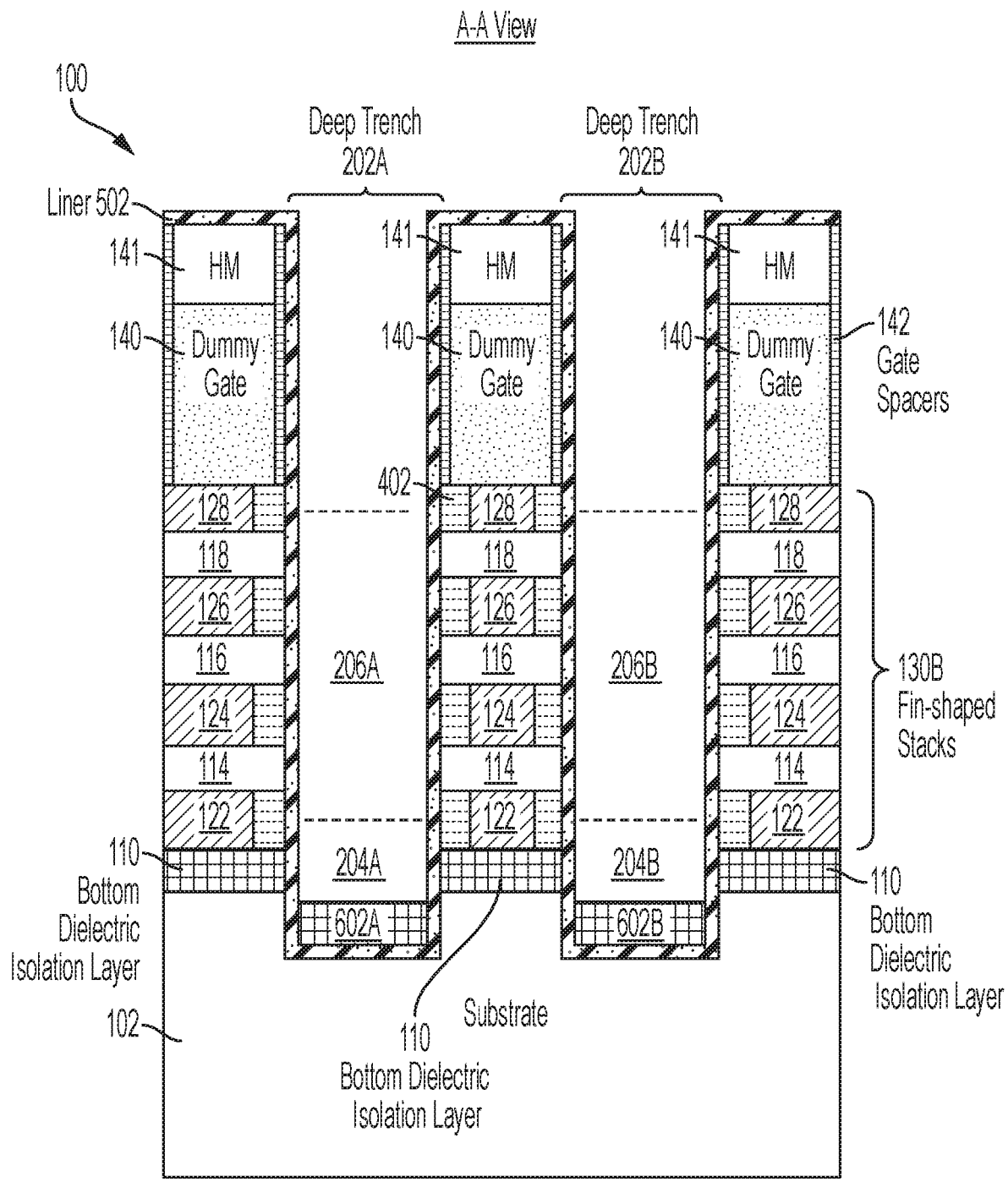

FIG. 8 depicts a cross-sectional view, taken along line A-A of FIGS. 11B and 12B, of the nanosheet-based structure 100 after additional fabrication operations in accordance with aspects of the present invention. As shown in FIG. 8, known semiconductor fabrication processes have been used to form under-contact spacers 602A, 602B within the bottom trench regions 204A, 204B configured and arranged as shown. In embodiments of the invention, the under-contact spacers 602A, 602B can be deposited using a high density plasma-based (HDP-based) anisotropic deposition process followed by an anisotropic etch back to form the under-contact spacers 602A, 602B. The under-contact spacers 602A, 602B can be formed from an oxide containing material. In accordance with aspects of the invention, the under-contact spacers 602A, 602B are positioned over the liner 502 and within the deep trenches 202A, 202B, and more specifically within the bottom trench regions 204A, 204B.

Figure 9:
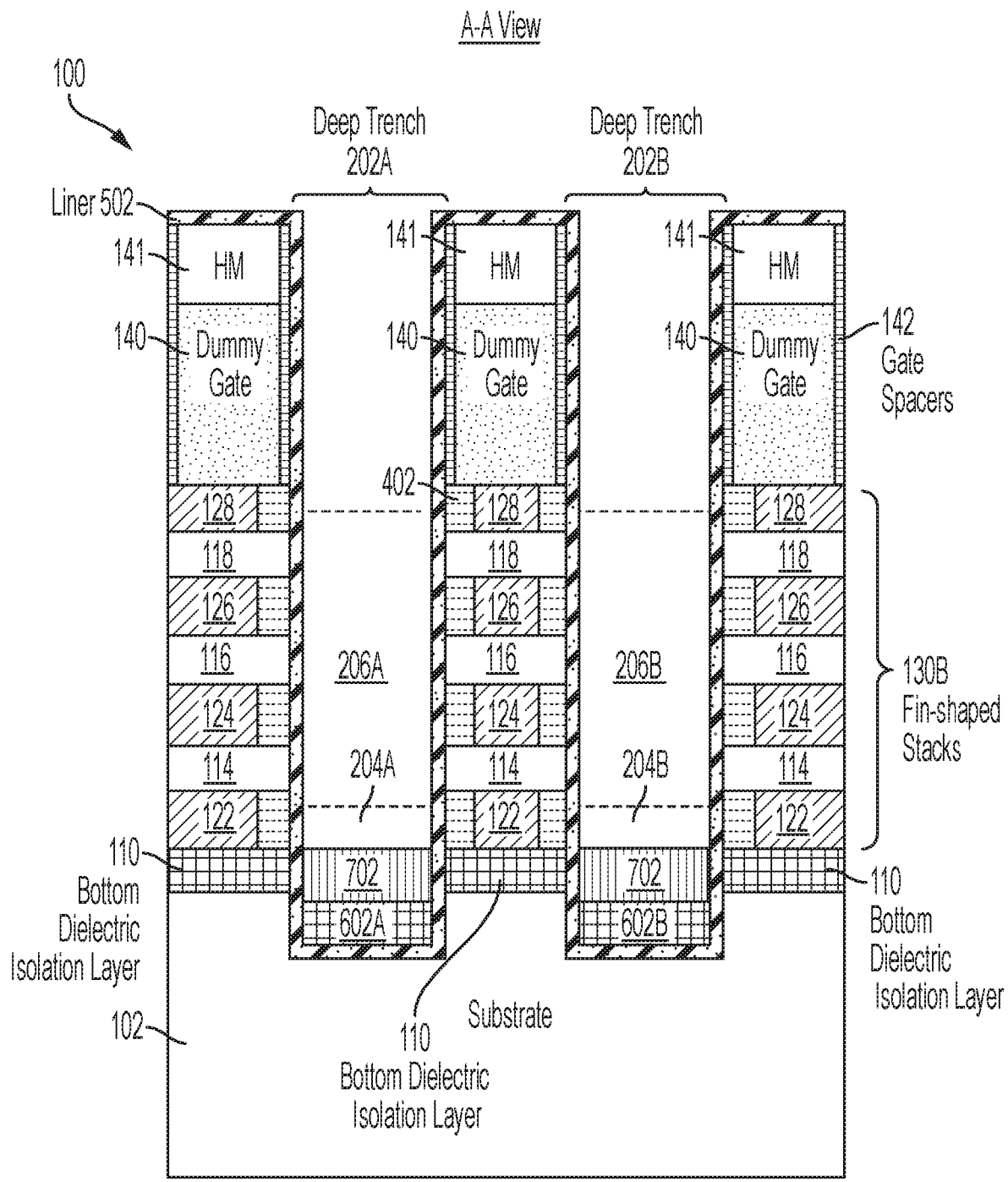

FIG. 9 depicts a cross-sectional view, taken along line A-A of FIGS. 11B and 12B, of the nanosheet-based structure 100 after additional fabrication operations in accordance with aspects of the present invention. As shown in FIG. 9, known semiconductor fabrication processes have been used to form protective organic planarization layers (OPLs) 702 within the deep trenches 202A, 202B and recess them to predetermined levels as shown. In general, OPLs are used as etch masks for pattern transfers into inorganic substrates, to fill pre-existing features, and to planarize the substrate to allow for larger patterning process windows. In accordance with aspects of the invention, each of the OPLs 702 is etched back to a predetermined level that is above a major surface of the substrate 102. In accordance with aspects of the invention, each of the OPLs 702 is etched back to a predetermined level that is above a major surface of the substrate 102 and at or below top surfaces of the isolation regions 110. In accordance with aspects of the invention, the OPLs 702 protect the underlying under-contact spacers 602A, 602B from being impacted by downstream processing operations.

Figure 10:
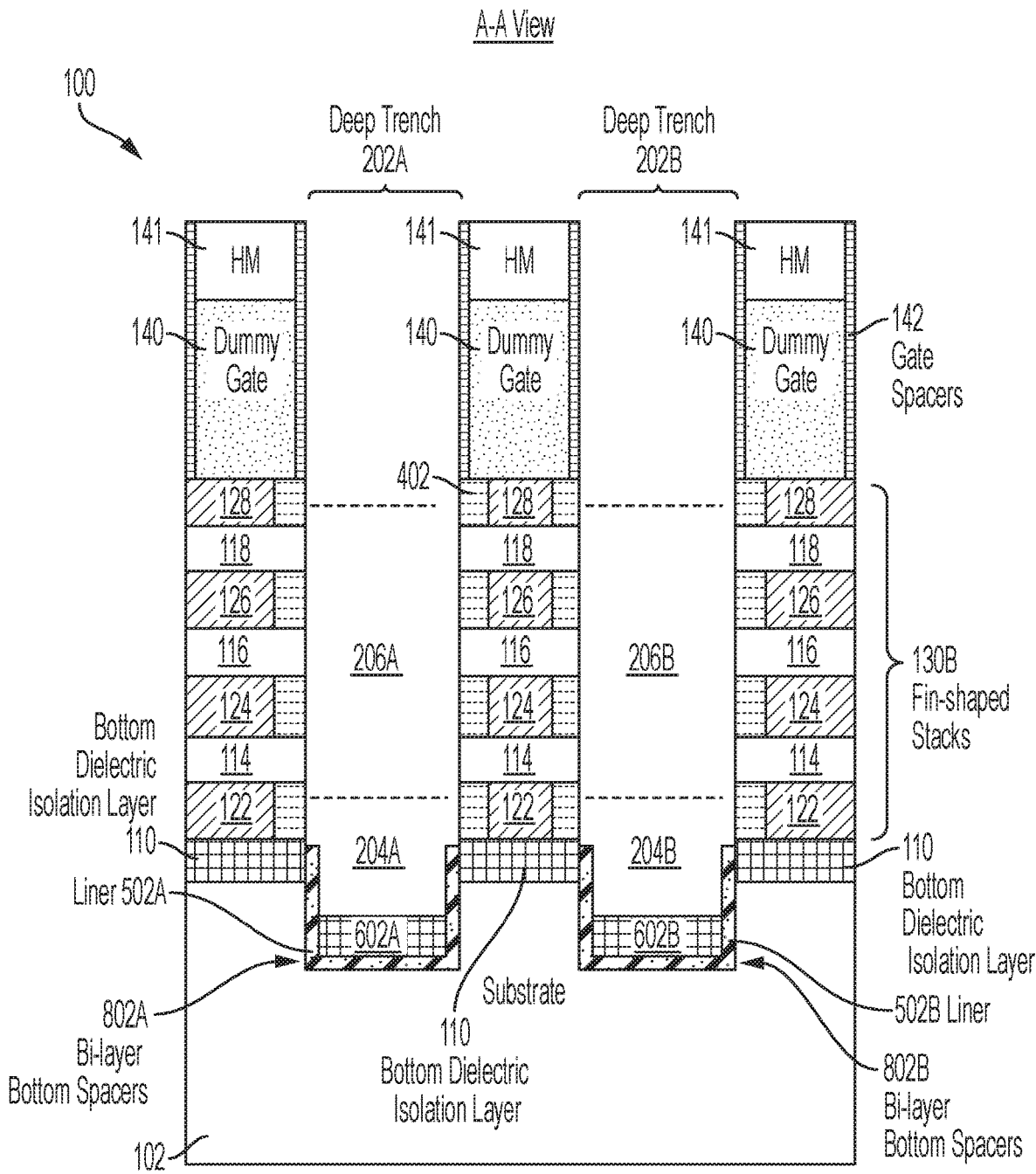
Figure 11A:
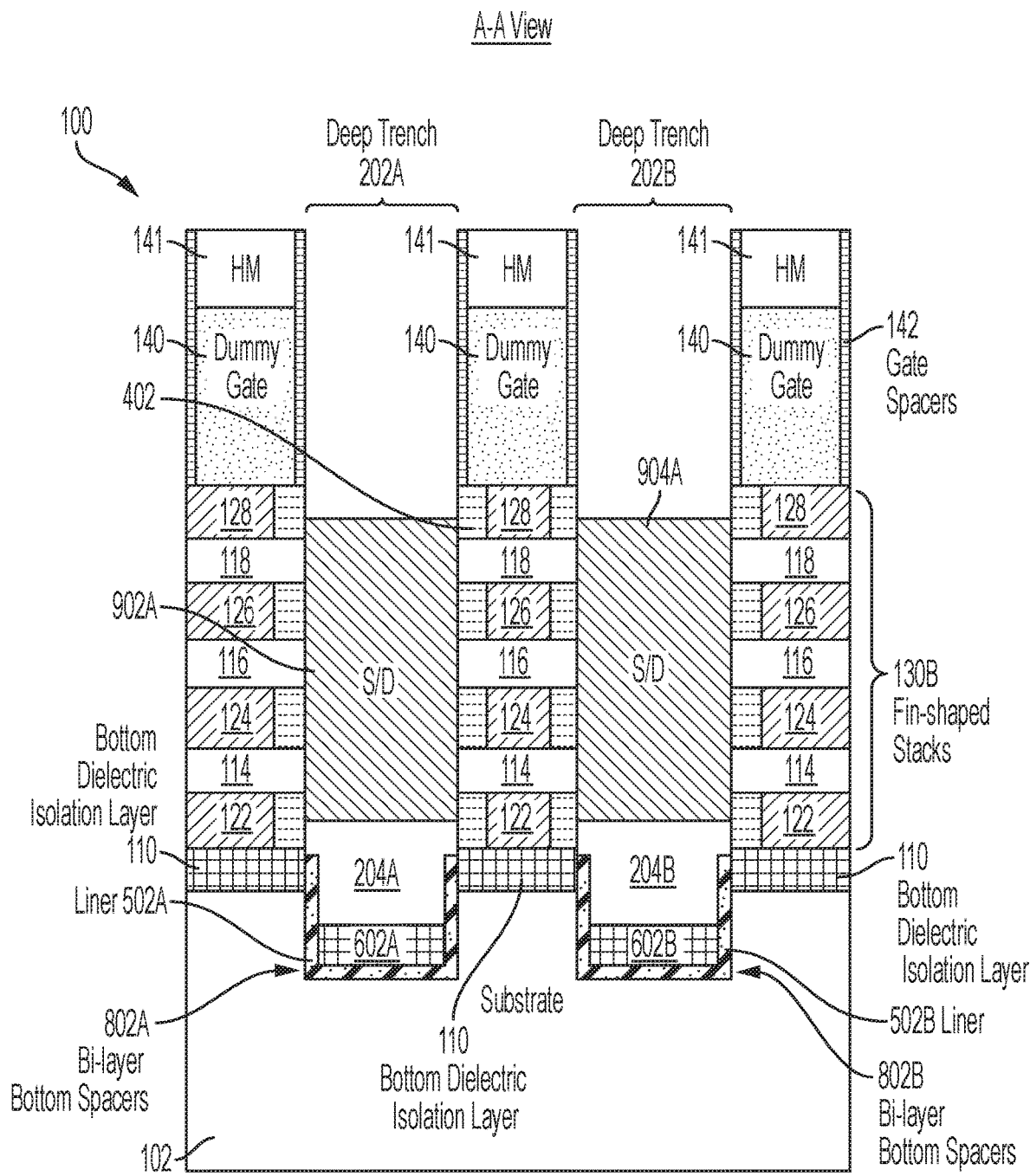
FIG. 11A depicts a cross-sectional view, taken along line A-A of FIGS. 11B and 12B, of the nanosheet-based structure after additional fabrication operations in accordance with aspects of the present invention.
Figure 11B:
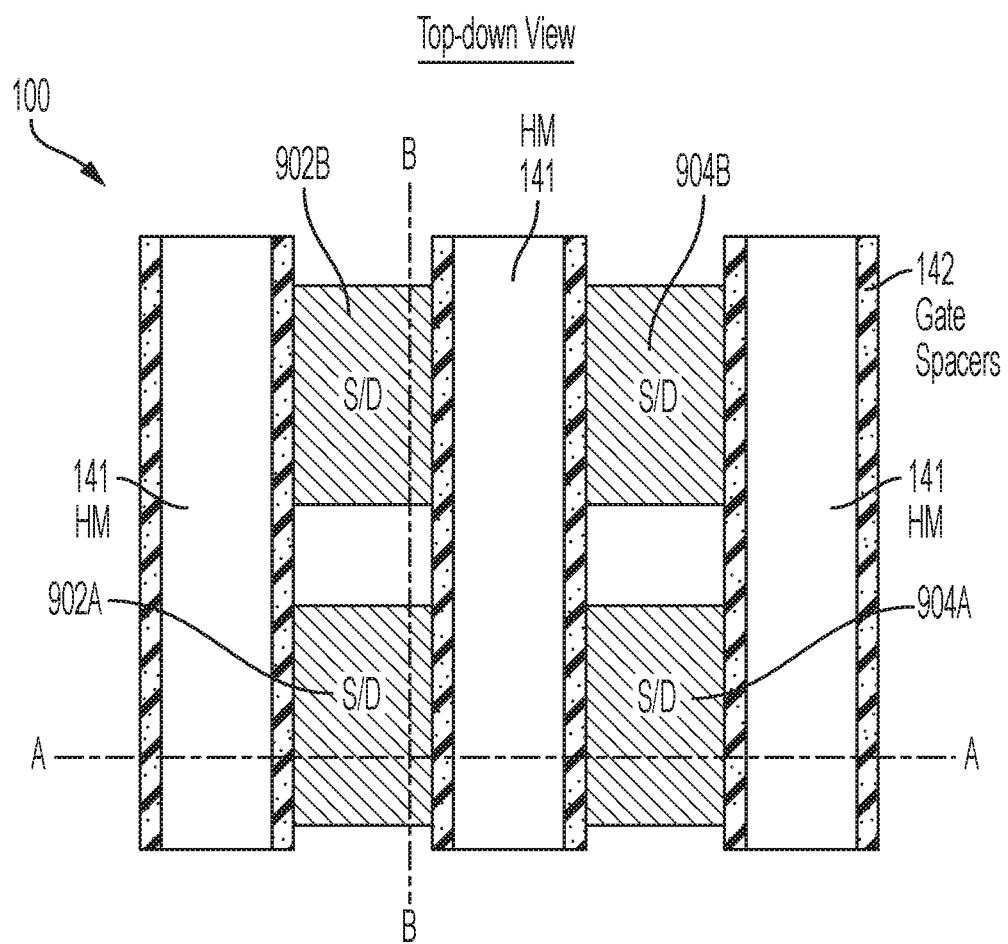
FIG. 11B depicts a top-down view of the nanosheet-based structure after additional fabrication operations in accordance with aspects of the present invention.
Figure 12A:
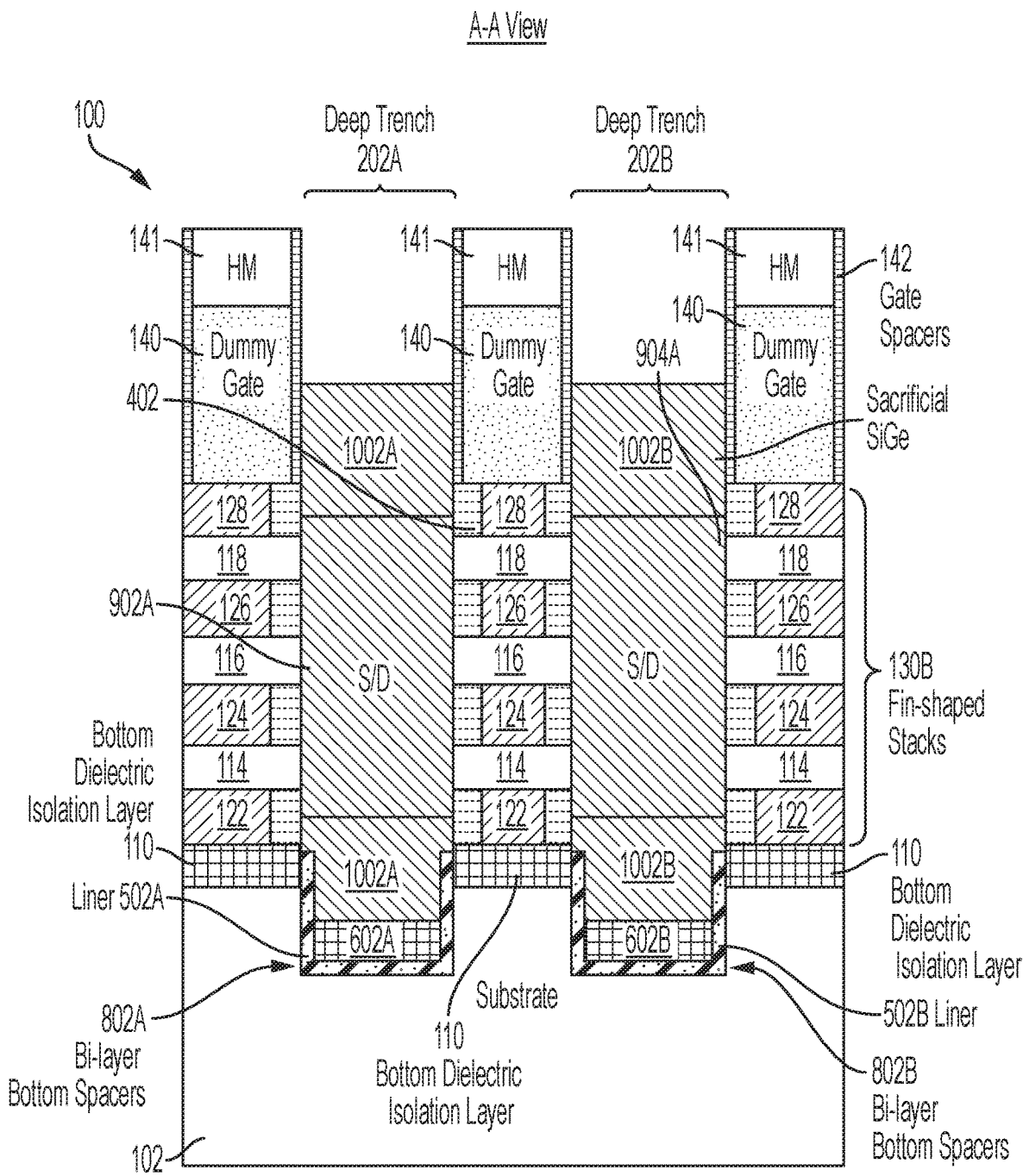
FIG. 12A depicts a cross-sectional view, taken along line A-A of FIGS. 11B and 12B, of the nanosheet-based structure after additional fabrication operations in accordance with aspects of the present invention.
Figure 12B:
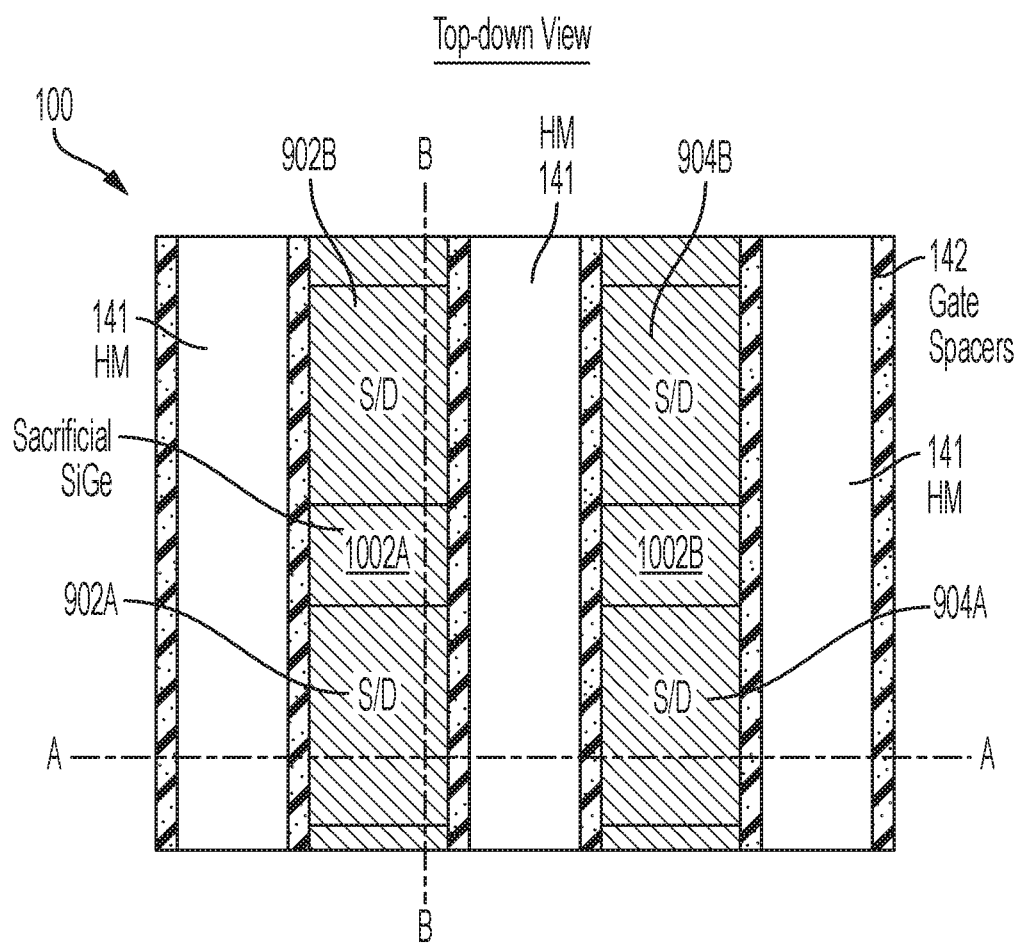
FIG. 12B depicts a top-down view of the nanosheet-based structure after additional fabrication operations in accordance with aspects of the present invention.

FIG. 10 depicts a cross-sectional view, taken along line A-A of FIGS. 11B and 12B, of the nanosheet-based structure 100 after additional fabrication operations in accordance with aspects of the present invention. As shown in FIG. 10, known semiconductor fabrication processes have been used to etch back the liner 502 to form liners 502A, 502B at the level of the top surfaces of the protective OPLs 702 and remove the protective OPLs 702 from within the deep trenches 202A, 202B. In embodiments of the invention, the liners 502A, 502B are above the substrate 102 to prevent the wrap-around S/D contacts 1402A, 1404A (shown in FIG. 16A) from contacting the substrate 102. In aspects of the invention, the OPLs 702 can be removed using a dry etch process (e.g., an OPL ashing process).

FIG. 11A depicts a cross-sectional view, taken along line A-A of the top-down view shown in FIG. 11B, of the nanosheet-based structure 100 after additional fabrication operations in accordance with aspects of the present invention. As best shown in FIG. 11A, known semiconductor fabrication processes have been used to form raised S/D regions 902A, 904A, 902B, 904B within the S/D trench regions 206A, 206B of the deep trenches 202A, 202B. In embodiments of the invention, the raised S/D regions 902A, 904B, 902B, 904B are formed using an epitaxial layer growth process to grow separate S/D regions (not shown) on the exposed ends of the channel nanosheets 114, 116, 118 until the separate S/D regions merge, thereby forming the raised/merged S/D regions 902A, 904B, 902B, 904B and communicatively coupling them to the exposed ends of the channel nanosheets 114, 116, 118. Materials can be epitaxially grown from gaseous or liquid precursors. Epitaxial materials can be grown using chemical vapor deposition (CVD), vapor-phase epitaxy (VPE), molecular-beam epitaxy (MBE), liquid-phase epitaxy (LPE), or other suitable processes. Epitaxial silicon, silicon germanium, and/or carbon doped silicon (Si:C) can be doped during deposition (in-situ doped) by adding dopants, n-type dopants (e.g., phosphorus or arsenic) or p-type dopants (e.g., boron or gallium), depending on the type of transistor. In aspects of the invention, in-situ doping (ISD) is applied to dope the S/D regions 902A, 904B, 902B, 904B, thereby creating the necessary junctions in the nanosheet-based structure 100. Virtually all semiconductor transistors are based on the formation of junctions. Junctions are capable of both blocking current and allowing it to flow, depending on an applied bias. Junctions are typically formed by placing two semiconductor regions with opposite polarities into contact with one another. The most common junction is the p-n junction, which consists of a contact between a p-type piece of silicon, rich in holes, and an n-type piece of silicon, rich in electrons. N-type and p-type FETs are formed by implanting different types of dopants to selected regions of the device to form the necessary junction(s). N-type devices can be formed by implanting arsenic (As) or phosphorous (P), and p-type devices can be formed by implanting boron (B).

FIG. 12A depicts a cross-sectional view, taken along line A-A of the top-down view shown in FIG. 12B, of the nanosheet-based structure 100 after additional fabrication operations in accordance with aspects of the present invention. As best shown in FIG. 12A, known semiconductor fabrication processes have been used to form sacrificial wrap-around S/D contacts 1002A, 1002B within the deep trenches 202A, 202B. In accordance with aspects of the invention, the sacrificial wrap-around S/D contacts 1002A, 1002B wrap completely around top surfaces, bottom surfaces and sidewalls (i.e., around a circumference) of the S/D regions 902A, 904A, 902B, 904B within the deep trenches 202A, 202B. In embodiments of the invention, the sacrificial wrap-around contacts 1002A, 1002B each includes a bottom region that is within the bottom trench regions 204A, 204B. In accordance with aspects of the invention, the sacrificial wrap-around contacts 1002A, 1002B are formed from SiGe having sufficient etch selectivity (e.g., SiGe85%) to the remaining portions of the structure 100 that the sacrificial wrap-around contacts 1002A, 1002B can be selectively removed by downstream fabrication operations. In aspects of the invention, the sacrificial wrap-around contacts 1002A, 1002B are SiGe85% epitaxially grown from the exposed surfaces of the S/D regions 902A, 904A, 902B, 904B.

Figure 13:
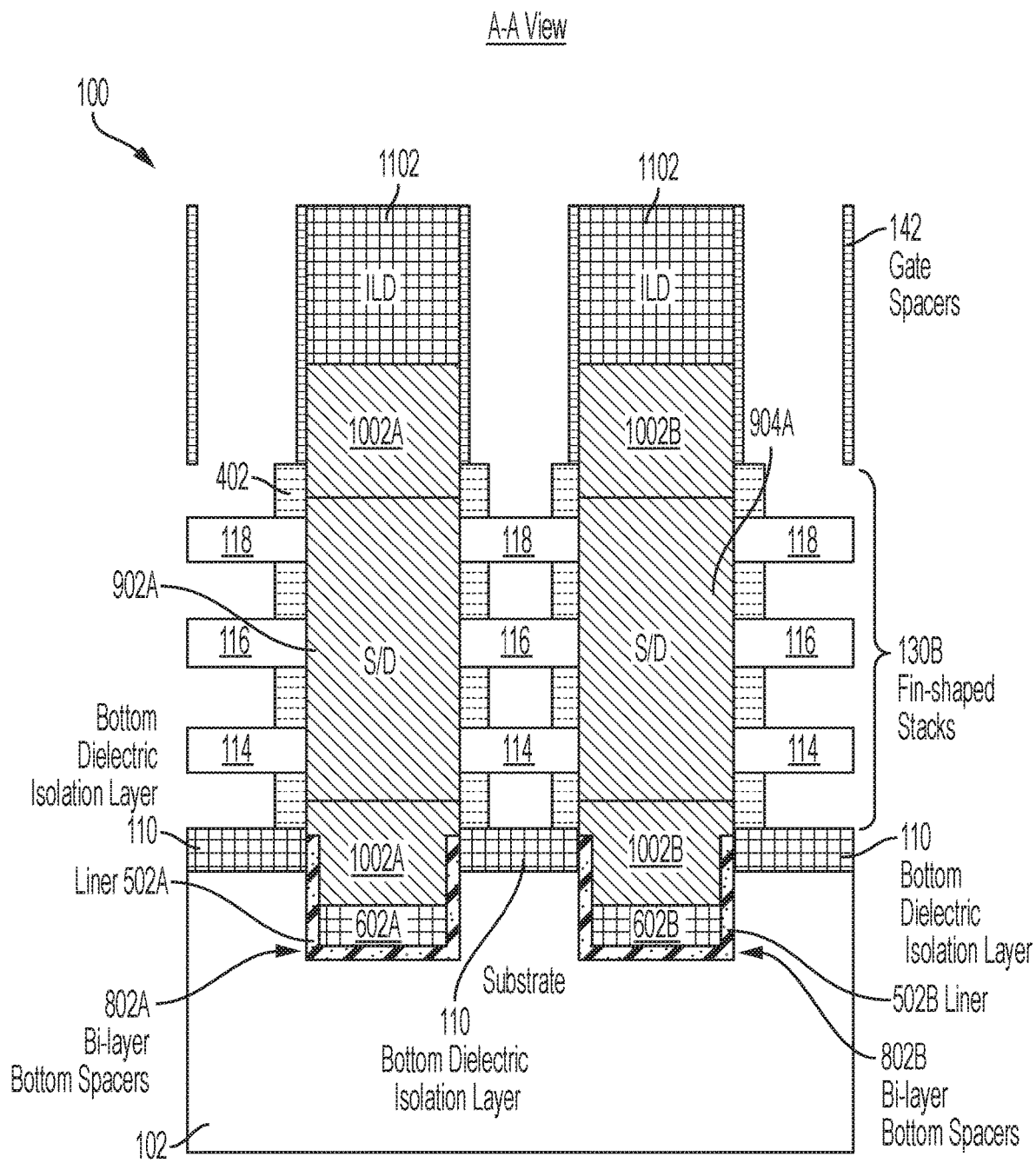

FIG. 13 depicts a cross-sectional view, taken along line A-A of the top-down views shown in FIGS. 11B and 12B, of the nanosheet-based structure 100 after additional fabrication operations in accordance with aspects of the present invention. As shown in FIG. 13, known semiconductor fabrication processes have been used to deposit an interlayer dielectric (ILD) fill 1102 within the remaining portions of the deep trenches 202A, 202B (shown in FIG. 12A). The ILD fill 1102 can be formed by depositing an oxide material in bulk (e.g., silicon dioxide) and polishing the bulk oxide back (e.g., using CMP) to the level shown. Additionally, known semiconductor fabrication operations (e.g., a replacement metal gate (RMG) processes) have been used remove the dummy gates 140 and hard masks 141 (both shown in FIG. 12A) using, for example, a known etching process, e.g., any suitable wet or gas-phase etch process. Additionally, known semiconductor fabrication operations have been used to remove the sacrificial SiGe layers 122, 124, 126, 128 (shown in FIG. 12A). In embodiments of the invention, the sacrificial SiGe layers 122, 124, 126, 128 can be removed by applying a selective etch (e.g., a hydrochloric acid (HCl) or a gas phase reactive etch process).

Figure 14:
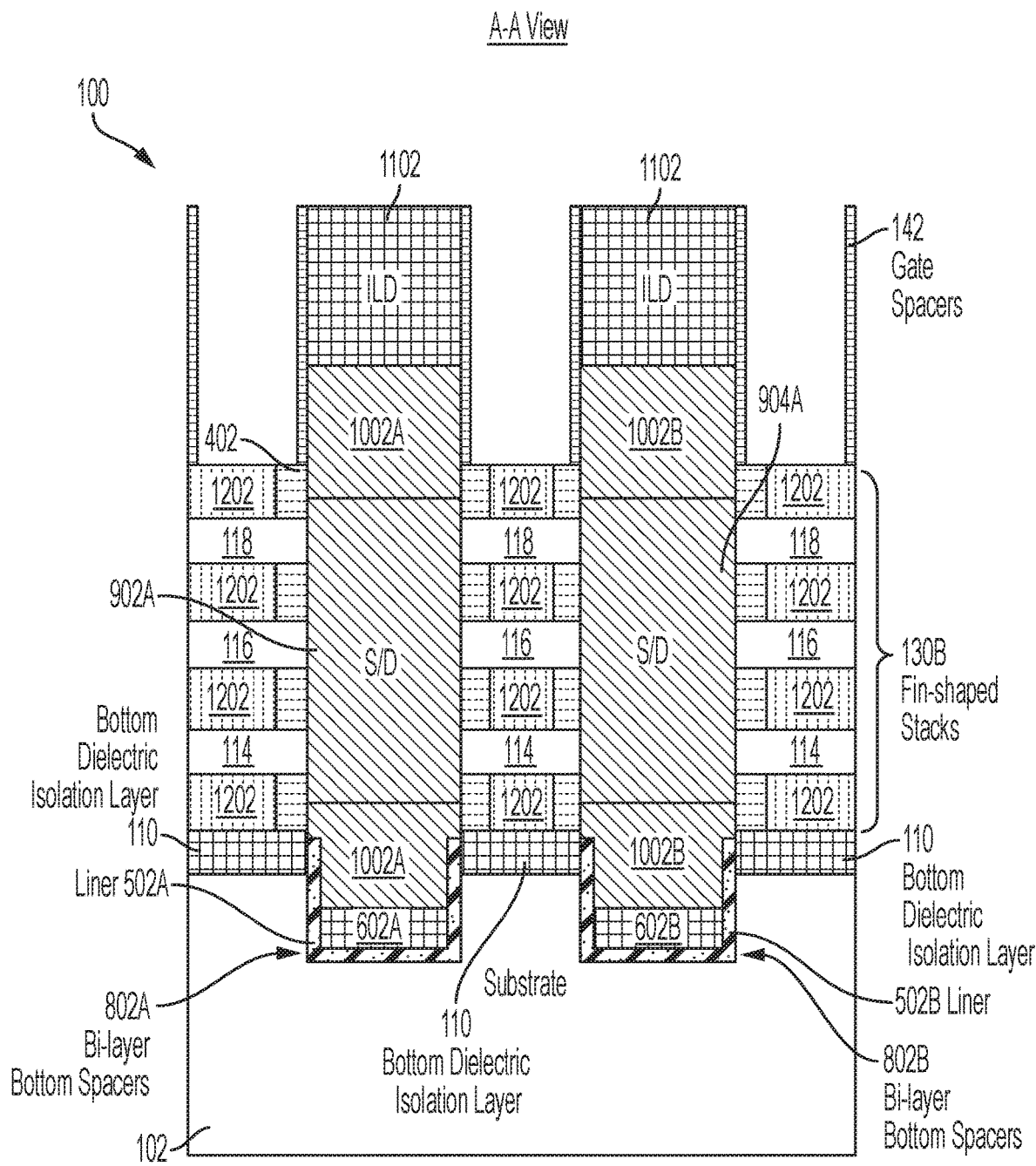

FIG. 14 depicts a cross-sectional view, taken along line A-A of FIGS. 11B and 12B, of the nanosheet-based structure 100 after additional fabrication operations in accordance with aspects of the present invention. As shown in FIG. 14, known semiconductor fabrication processes have been used to replace the removed dummy gates 140 and hard masks 141 (both shown in FIG. 12A) with a multi-segmented gate stack structure 1202, which can include a primary metal region, a work function metal (WFM) (not shown separately), and a relatively thin (e.g., from about 0.7 nm to about 3 nm) high-k gate dielectric (e.g., hafnium oxide) (not shown separately). The gate stack structure 1202 surrounds the stacked channel nanosheet channels 114, 116, 118 and regulates electron flow through the channel nanosheet channels 114, 116, 118 between the S/D regions 902A, 904A.

The primary metal region of the gate stack structure 1202 can be formed of any suitable conducting material, including but not limited to, doped polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The primary metal region can further include dopants that are incorporated during or after deposition.

Examples of suitable materials for the gate dielectric of the gate stack structure 1202 include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k gate dielectric can further include dopants such as lanthanum, aluminum, magnesium. In some embodiments of the invention, the gate dielectric can further include silicon oxide, silicon nitride, silicon oxynitride, or any suitable combination of those materials with high-k dielectric material. In embodiments of the invention, the relatively thin gate dielectric is between the channel nanosheets 114, 116, 118 and the primary gate metal region to prevent shorting.

In embodiments of the invention, the WFM layers of the gate stack structure 1202 can be a nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof (e.g., titanium nitride, titanium aluminum nitride, titanium aluminum carbide, titanium aluminum carbon nitride, and tantalum nitride) and other appropriate metals and conducting metal layers (e.g., tungsten, cobalt, tantalum, aluminum, ruthenium, copper, metal carbides, and metal nitrides).

Figure 15:
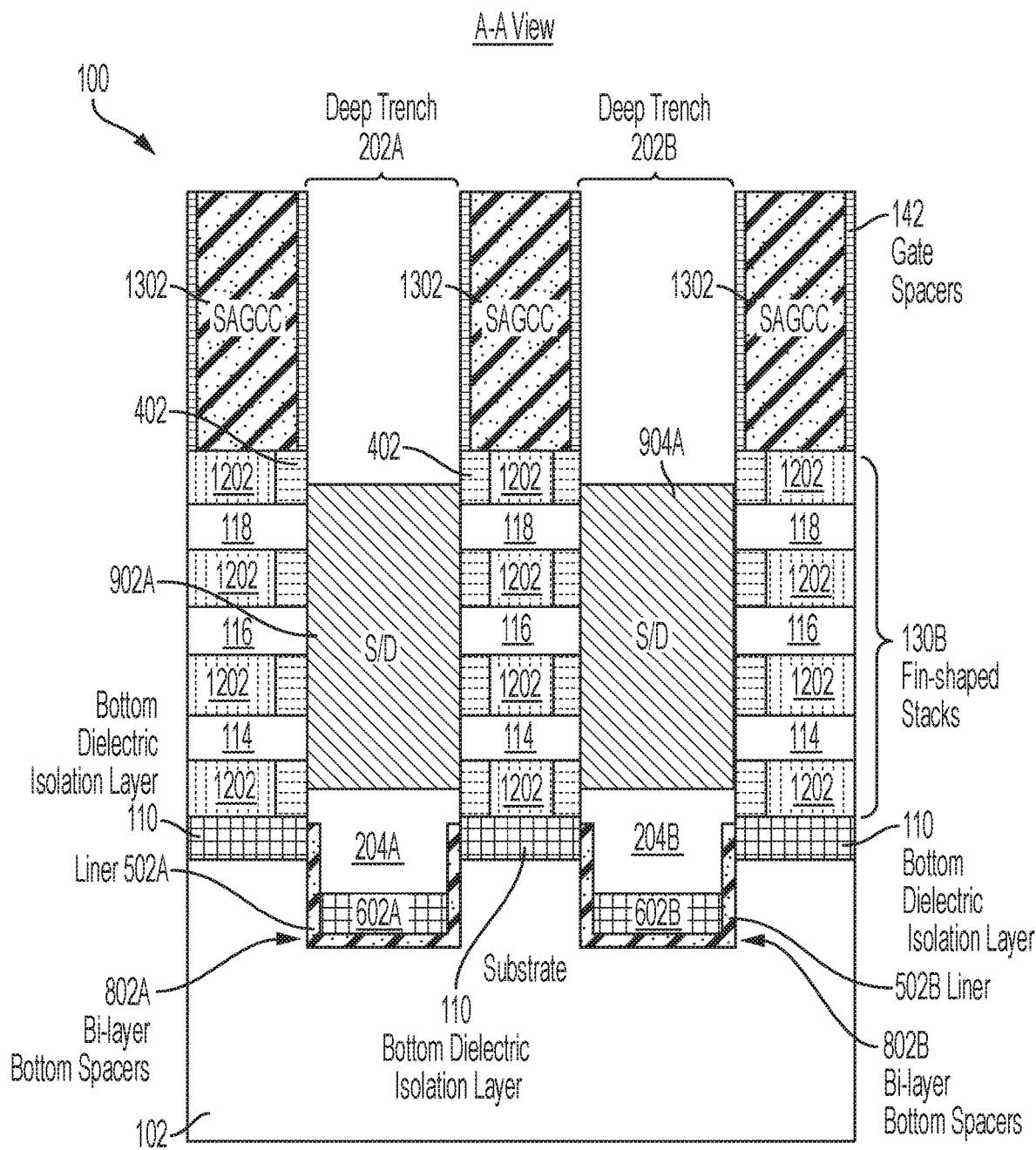

FIG. 15 depicts a cross-sectional view, taken along line A-A of the top-down views shown in FIGS. 11B and 12B, of the nanosheet-based structure 100 after additional fabrication operations in accordance with aspects of the present invention. As shown in FIG. 15, known semiconductor fabrication processes have been used to selectively recess the gate structure 1202 and deposit (e.g., using ALD) a nitride fill material in the spaces that were occupied by the dummy gates 140 (shown in FIG. 12A), thereby forming self-aligned contact caps (SACs) 1302. Additionally, known semiconductor fabrication processes have been used to remove the ILD 1102 (shown in FIG. 14). Additionally, known semiconductor fabrication operations have been used to remove the sacrificial wrap-around contacts 1002A, 1002B (shown in FIG. 12A). In embodiments of the invention, the sacrificial wrap-around contacts 1002A, 1002B can be removed by applying a selective etch (e.g., a hydrochloric acid (HCl)) configured to selectively etch SiGe (or SiGe85%). In some embodiments of the invention, the sacrificial wrap-around contacts 1002A, 1002B are removed except for portions of the sacrificial wrap-around contacts 1002A, 1002B that are on portions of the bottom surfaces of the raised/merged S/D regions 902A, 904B, respectively. At this fabrication stage, the deep trenches 202A, 202B have been reopened such that the deep trenches 202A, 202B also function as S/D contact trenches.

Figure 16A:
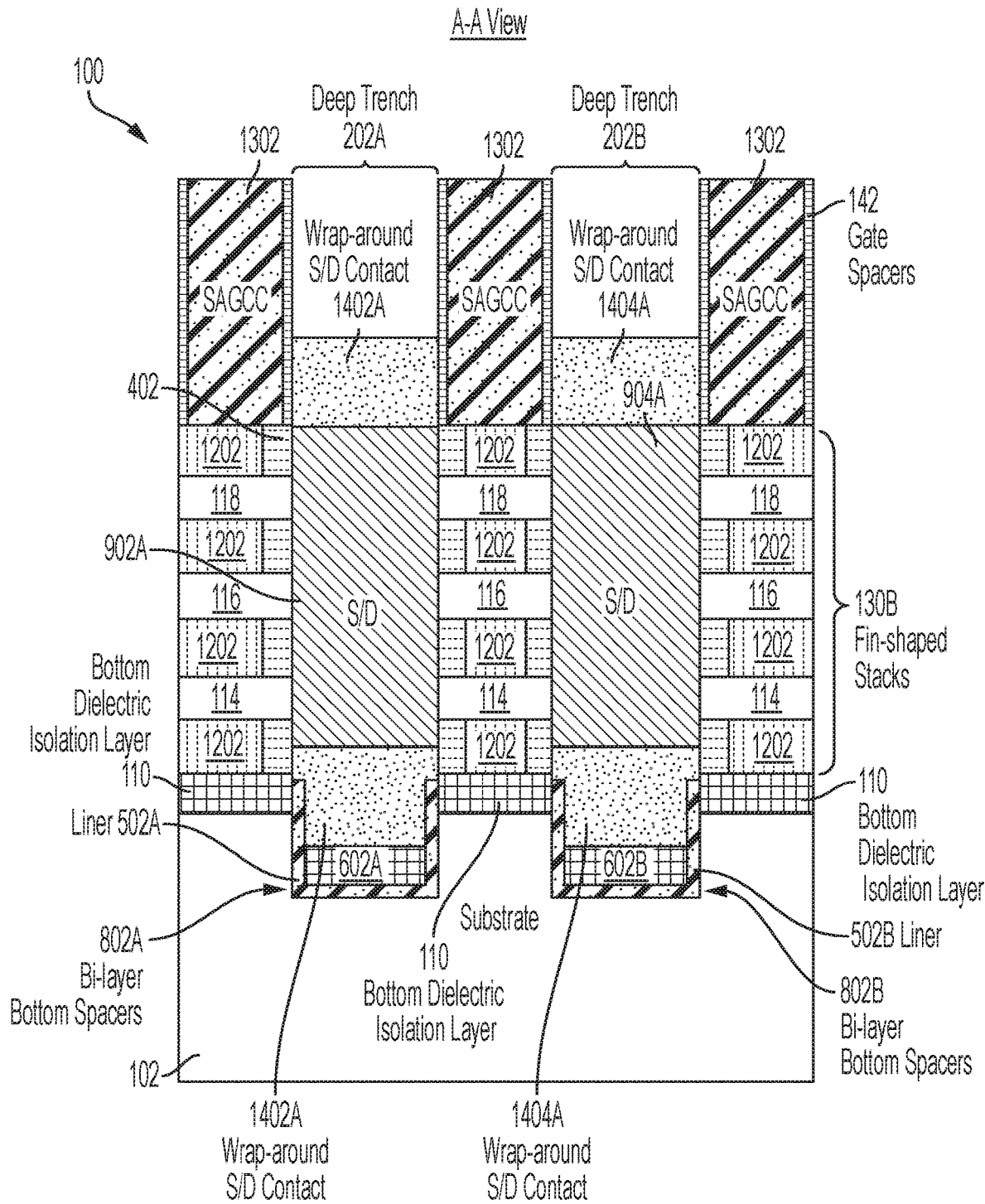
FIG. 16A depicts a cross-sectional view, taken along line A-A of FIGS. 11B and 12B, of the nanosheet-based structure after additional fabrication operations in accordance with aspects of the present invention.

FIG. 16A depicts a cross-sectional view, taken along line A-A of FIGS. 11B and 12B, of the nanosheet-based structure 100 after additional fabrication operations in accordance with aspects of the present invention, and FIG. 16B depicts a cross-sectional view, taken along line B-B of FIGS. 11B and 12B, of the nanosheet-based structure 100 after the same fabrication operations shown in FIG. 16A. As best shown in FIGS. 16A and 16B, known semiconductor fabrication operations have been used to form wrap-around S/D contact stacks 1402A, 1404A in the spaces that were occupied by the removed portions of the sacrificial wrap-around contacts 1002A, 1002B (shown in FIG. 14). In accordance with aspects of the invention, the wrap-around S/D contact stacks 1402A, 1404A can include contact liners (not shown separately), contact barrier layers (not shown separately), and S/D contact metal. In embodiments of the invention, the contact liners are configured to assist in minimizing contact resistance. In embodiments of the invention, the contact liners (e.g., Ti) are conformally and selectively deposited on the S/D regions 902A, 904A to form silicide regions. Example materials for forming the contact liners include tantalum nitride and tantalum (TaN/Ta), titanium, titanium nitride, cobalt, ruthenium, and manganese. The contact barrier layers can be titanium nitride (TiN), tantalum nitride (TaN), hafnium nitride (HfN), niobium nitride (NbN), tungsten nitride (WN), or combinations thereof, where the contact barrier layers can prevent diffusion and/or alloying of the S/D contact metal with the S/D regions 902A, 904A, 902B, 904B. In various embodiments of the invention, the contact barrier layers and/or the contact liners can be conformally deposited in the spaces that were occupied by the removed portions of the sacrificial wrap-around contacts 1002A, 1002B by ALD, CVD, MOCVD, PECVD, or combinations thereof. The S/D contact metal can be tungsten (W), aluminum (Al), copper (Cu), cobalt (Co). The S/D contact metal can also be formed from any of the conductive materials previously described herein as suitable conductive materials for the gate stack 1202. In embodiments of the invention, the S/D contact metal can be formed conformally by ALD, CVD, and/or PVD. By using a conformal process to deposit the S/D contact metal, a uniform thickness of material is across all exposed surfaces regardless of whether the surface is facing upward or facing downward. By controlling the sequence of the conformal depositions of the liner, the barrier, and the contact metal, the appropriate positioning of the liner, the barrier and the contact metal in the bottom portions of the wrap-around S/D contacts 1402A, 1404A is ensured. As noted above, the conformal liner (e.g., Ti) needed for silicide formation can be selectively deposited on the S/D regions 902A, 904A. Known gate contact fabrication methods can be used to form contacts for the gate stack 1202.

In embodiments of the invention, the wrap-around S/D contact stacks 1402A, 1404A are on top surfaces, sidewalls, and bottom surfaces of the S/D regions 902A, 904A. In some embodiment of the invention, for example, where portions of the sacrificial wrap-around contacts 1002A, 1002B remains on bottom surfaces of the S/D regions 902A, 904A, the wrap-around S/D contact stacks 1402A, 1404A are on the bottom surfaces of the S/D regions 902A, 904A but do not extend completely around the circumferences of the S/D regions 902A, 904A. In some embodiment of the invention, the wrap-around S/D contact stacks 1402A, 1404A are configured to extend completely around a circumference of the S/D region.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the detailed description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

As previously noted herein, for the sake of brevity, conventional techniques related to semiconductor device and IC fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of forming a semiconductor device, the method comprising:
    forming a first channel region over a substrate;
    forming a second channel region over the first channel region;
    forming a source or drain (S/D) trench having a S/D trench region and a bottom trench region;
    forming a liner within the bottom trench region;
    wherein the liner comprises a first liner element on a bottom surface of the bottom trench region;
    wherein the liner further comprises a second liner element on sidewalls of the bottom trench region;
    forming an under-contact spacer on the first liner element and along first portions of the second liner element such that second portions of the second liner element extend above the under-contact spacer;
    forming a merged source or drain (S/D) region within the S/D trench region and adjacent to the first channel region and the second channel region, wherein the merged S/D region comprises a top surface, sidewalls, and a bottom surface;
    communicatively coupling the merged S/D region to the first channel region and the second channel region; and
    forming a wrap-around S/D contact such that a portion of the wrap-around S/D contact is between the bottom surface of the merged S/D region and a bi-layer bottom spacer comprising the liner and the under-contact spacer.

2. The method of claim 1, wherein the merged S/D region is configured to extend completely around a circumference of the merged S/D region, wherein the circumference of the merged S/D region comprises the top surface, the sidewalls, and the bottom surface of the merged S/D region.

3. The method of claim 1, wherein forming the merged S/D region and communicatively coupling the merged S/D region to the first channel region and the second channel region comprise:
    epitaxially growing a first S/D region from the first channel region;
    epitaxially growing a second S/D region from the second channel region; and
    continuing epitaxially growing the first S/D region and the second S/D region until the first S/D region merges with the second S/D region to form the merged S/D region.

4. The method of claim 1, wherein the bi-layer bottom spacer is positioned between the wrap-around S/D contact and the substrate.

5. The method of claim 1, wherein the liner comprises a nitride material and the under-contact spacer layer comprises an oxide material.

6. A method of forming a semiconductor device, the method comprising:
    forming a channel region over a substrate;
    forming a source or drain (S/D) trench over the substrate, wherein the S/D trench comprises a bottom trench region extending below a major surface of the substrate;
    forming a liner within the bottom trench region;
    wherein the liner comprises a first liner element on a bottom surface of the bottom trench region;

wherein the liner further comprises a second liner element on sidewalls of the bottom trench region;

forming an under-contact spacer on the first liner and along first portions of the second liner element such that second portions of the second liner element extend above the under-contact spacer;

forming a S/D region within the S/D trench and adjacent to the channel region, wherein the S/D region comprises a top surface, sidewalls, and a bottom surface, wherein the S/D region does not extend below the major surface of the substrate and does not extend into the bottom trench region;

communicatively coupling the S/D region to the channel region; and forming a wrap-around S/D contact such that a portion of the wrap-around S/D contact is beneath the bottom surface of the S/D region.

7. The method of claim 6, wherein forming the wrap-around contact comprises:

forming a sacrificial wrap-around S/D contact on the top surface, the sidewalls, and the bottom surface of the S/D region;

subsequent to forming the sacrificial S/D wrap-around contact, performing additional fabrication operations; and subsequent to performing the addition fabrication operations, replacing the sacrificial S/D wrap-around contact with the wrap-around S/D contact.

8. The method of claim 6, wherein the wrap-around S/D contact is configured to extend completely around a circumference of the S/D region, wherein the circumference of the S/D region comprises the top surface, the sidewalls, and the bottom surface of the S/D region.

9. The method of claim 6, wherein:

a bi-layer bottom spacer comprises the liner and the under-contact spacer; and the bit-layer bottom spacer is positioned between the wrap-around S/D contact and the substrate.

10. The method of claim 6, wherein the liner comprises a nitride material and the under-contact spacer layer comprises an oxide spacer material.

11. The method of claim 6, wherein:

the channel region comprises a first channel region and a second channel region;

the S/D region comprises a merged S/D region adjacent to the first channel region and the second channel region; and the merged S/D region is communicatively coupled to the first channel region and the second channel region.

* * * * *